US008084370B2

(12) United States Patent
Forbes et al.

(10) Patent No.: US 8,084,370 B2
(45) Date of Patent: Dec. 27, 2011

(54) HAFNIUM TANTALUM OXYNITRIDE DIELECTRIC

(75) Inventors: Leonard Forbes, Corvallis, OR (US); Kie Y. Ahn, Chappaqua, NY (US); Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/581,628

(22) Filed: Oct. 19, 2009

(65) Prior Publication Data

US 2010/0041244 A1 Feb. 18, 2010

Related U.S. Application Data

(62) Division of application No. 11/515,114, filed on Aug. 31, 2006, now Pat. No. 7,605,030.

(51) Int. Cl.
*H01L 21/31* (2006.01)

(52) U.S. Cl. ........ 438/778; 438/785; 257/632; 257/635; 257/E21.295

(58) Field of Classification Search .................. 438/184, 438/299, 303, 778, 785; 257/387, E29.255, 257/632, 635, E21.295
See application file for complete search history.

(56) References Cited

U.S. PATENT DOCUMENTS

| 4,542,870 | A | 9/1985 | Howell |
|---|---|---|---|
| 5,252,370 | A | 10/1993 | Tominaga et al. |
| 5,334,433 | A | 8/1994 | Tominaga |
| 5,364,708 | A | 11/1994 | Tominaga |
| 5,401,609 | A | 3/1995 | Haratani et al. |
| 5,406,546 | A | 4/1995 | Uchiyama et al. |
| 5,418,030 | A | 5/1995 | Tominaga et al. |
| 5,430,706 | A | 7/1995 | Utsunomiya et al. |
| 5,470,628 | A | 11/1995 | Tominaga et al. |
| 5,498,507 | A | 3/1996 | Handa et al. |
| 5,523,140 | A | 6/1996 | Tominaga et al. |
| 5,552,237 | A | 9/1996 | Utsunomiya et al. |
| 5,569,517 | A | 10/1996 | Tominaga et al. |
| 5,577,020 | A | 11/1996 | Utsunomiya et al. |
| 5,593,789 | A | 1/1997 | Utsunomiya et al. |
| 5,620,766 | A | 4/1997 | Uchiyama et al. |
| 5,627,012 | A | 5/1997 | Tominaga et al. |
| 5,637,371 | A | 6/1997 | Tominaga et al. |

(Continued)

FOREIGN PATENT DOCUMENTS

EP 1096042 A1 5/2001

(Continued)

OTHER PUBLICATIONS

Atanassova, E., et al., "Breakdown Fields and Conduction Mechanisms in thin $Ta_2O_5$ Layers on Si for high density DRAMs", *Microelectronics Reliability*, 42, (2002), 157-173.

(Continued)

*Primary Examiner* — Hsien Ming Lee
(74) *Attorney, Agent, or Firm* — Schwegman, Lundberg & Woessner, P.A.

(57) ABSTRACT

Electronic apparatus and methods may include a hafnium tantalum oxynitride film on a substrate for use in a variety of electronic systems. The hafnium tantalum oxynitride film may be structured as one or more monolayers. The hafnium tantalum oxynitride film may be formed using atomic layer deposition. Metal electrodes may be disposed on a dielectric containing a hafnium tantalum oxynitride film.

25 Claims, 13 Drawing Sheets

U.S. PATENT DOCUMENTS

| | | | |
|---|---|---|---|
| 5,637,372 | A | 6/1997 | Tominaga et al. |
| 5,700,567 | A | 12/1997 | Utsunomiya |
| 5,825,046 | A | 10/1998 | Czubatyj et al. |
| 5,891,542 | A | 4/1999 | Tominaga et al. |
| 5,906,874 | A | 5/1999 | Takahashi et al. |
| 5,965,323 | A | 10/1999 | Takahashi et al. |
| 5,981,014 | A | 11/1999 | Tsukagoshi et al. |
| 5,994,240 | A | 11/1999 | Thakur |
| 6,002,418 | A | 12/1999 | Yoneda et al. |
| 6,020,024 | A | 2/2000 | Maiti et al. |
| 6,030,679 | A | 2/2000 | Saito et al. |
| 6,040,030 | A | 3/2000 | Utsunomiya et al. |
| 6,051,363 | A | 4/2000 | Utsunomiya et al. |
| 6,061,077 | A | 5/2000 | Kashiwaya et al. |
| 6,081,287 | A | 6/2000 | Noshita et al. |
| 6,087,067 | A | 7/2000 | Kato et al. |
| 6,087,674 | A | 7/2000 | Ovshinsky et al. |
| 6,103,330 | A | 8/2000 | Kosuda et al. |
| 6,136,168 | A | 10/2000 | Masujima et al. |
| 6,137,520 | A | 10/2000 | Kashiwaya et al. |
| 6,153,355 | A | 11/2000 | Takahashi et al. |
| 6,175,377 | B1 | 1/2001 | Noshita et al. |
| 6,242,157 | B1 | 6/2001 | Tominaga et al. |
| 6,243,941 | B1 | 6/2001 | Kashiwaya et al. |
| 6,256,052 | B1 | 7/2001 | Yoneda |
| 6,256,053 | B1 | 7/2001 | Noshita et al. |
| 6,316,054 | B1 | 11/2001 | Kashiwaya et al. |
| 6,329,036 | B1 | 12/2001 | Kikukawa et al. |
| 6,337,704 | B1 | 1/2002 | Yamaguchi |
| 6,351,276 | B1 | 2/2002 | Yamaguchi |
| 6,352,591 | B1 | 3/2002 | Yieh et al. |
| 6,358,766 | B1 | 3/2002 | Kasahara |
| 6,383,873 | B1 | 5/2002 | Hegde et al. |
| 6,406,772 | B2 | 6/2002 | Tominaga et al. |
| 6,407,435 | B1 | 6/2002 | Ma et al. |
| 6,410,368 | B1 | 6/2002 | Kawasaki et al. |
| 6,426,245 | B1 | 7/2002 | Kawasaki et al. |
| 6,451,695 | B2 | 9/2002 | Sneh |
| 6,461,710 | B1 | 10/2002 | Kikukawa et al. |
| 6,492,659 | B1 | 12/2002 | Yamazaki et al. |
| 6,495,436 | B2 | 12/2002 | Ahn et al. |
| 6,514,828 | B2 | 2/2003 | Ahn et al. |
| 6,531,354 | B2 | 3/2003 | Maria et al. |
| 6,534,420 | B2 | 3/2003 | Ahn et al. |
| 6,537,721 | B2 | 3/2003 | Inoue et al. |
| 6,542,229 | B1 | 4/2003 | Kalal et al. |
| 6,555,875 | B2 | 4/2003 | Kawasaki et al. |
| 6,558,563 | B2 | 5/2003 | Kashiwaya et al. |
| 6,562,491 | B1 | 5/2003 | Jeon |
| 6,599,788 | B1 | 7/2003 | Kawasaki et al. |
| 6,613,695 | B2 | 9/2003 | Pomarede et al. |
| 6,617,639 | B1 | 9/2003 | Wang et al. |
| 6,624,013 | B2 | 9/2003 | Kawasaki et al. |
| 6,642,573 | B1 | 11/2003 | Halliyal et al. |
| 6,653,657 | B2 | 11/2003 | Kawasaki et al. |
| 6,660,660 | B2 | 12/2003 | Haukka et al. |
| 6,664,154 | B1 | 12/2003 | Bell et al. |
| 6,673,701 | B1 | 1/2004 | Marsh et al. |
| 6,688,951 | B2 | 2/2004 | Kashiwaya et al. |
| 6,730,164 | B2 | 5/2004 | Vaartstra et al. |
| 6,731,590 | B1 | 5/2004 | Shingai et al. |
| 6,748,959 | B1 | 6/2004 | Kashiwaya et al. |
| 6,750,126 | B1 | 6/2004 | Visokay et al. |
| 6,753,567 | B2 | 6/2004 | Maria et al. |
| 6,762,081 | B2 | 7/2004 | Yamazaki et al. |
| 6,762,114 | B1 | 7/2004 | Chambers |
| 6,767,795 | B2 | 7/2004 | Ahn et al. |
| 6,770,923 | B2 | 8/2004 | Nguyen et al. |
| 6,784,049 | B2 | 8/2004 | Vaartstra |
| 6,784,101 | B1 | 8/2004 | Yu et al. |
| 6,794,284 | B2 | 9/2004 | Vaartstra |
| 6,806,211 | B2 | 10/2004 | Shinriki et al. |
| 6,809,370 | B1 | 10/2004 | Colombo et al. |
| 6,812,517 | B2 | 11/2004 | Baker |
| 6,844,203 | B2 | 1/2005 | Ahn et al. |
| 6,844,249 | B2 | 1/2005 | Kawasaki et al. |
| 6,844,604 | B2 | 1/2005 | Lee et al. |
| 6,852,645 | B2 | 2/2005 | Colombo et al. |
| 6,863,725 | B2 | 3/2005 | Vaartstra et al. |
| 6,893,984 | B2 | 5/2005 | Ahn et al. |
| 6,900,122 | B2 | 5/2005 | Ahn et al. |
| 6,909,156 | B2 | 6/2005 | Aoyama |
| 6,916,398 | B2 | 7/2005 | Chen et al. |
| 6,921,702 | B2 | 7/2005 | Ahn et al. |
| 6,929,840 | B2 | 8/2005 | Hosoda et al. |
| 6,936,508 | B2 | 8/2005 | Visokay et al. |
| 6,949,433 | B1 | 9/2005 | Hidehiko et al. |
| 6,953,730 | B2 | 10/2005 | Ahn et al. |
| 6,958,300 | B2 | 10/2005 | Vaartstra et al. |
| 6,958,302 | B2 | 10/2005 | Ahn et al. |
| 6,960,538 | B2 | 11/2005 | Ahn et al. |
| 6,967,154 | B2 | 11/2005 | Meng et al. |
| 6,967,159 | B2 | 11/2005 | Vaartstra |
| 6,979,623 | B2 | 12/2005 | Rotondaro et al. |
| 6,979,855 | B2 | 12/2005 | Ahn et al. |
| 6,984,591 | B1 | 1/2006 | Buchanan et al. |
| 6,984,592 | B2 | 1/2006 | Vaartstra |
| 6,989,573 | B2 | 1/2006 | Ahn et al. |
| 6,995,081 | B2 | 2/2006 | Vaartstra |
| 7,014,903 | B2 | 3/2006 | Takasaki et al. |
| 7,015,534 | B2 | 3/2006 | Colombo |
| 7,018,694 | B2 | 3/2006 | Hosoda et al. |
| 7,018,695 | B2 | 3/2006 | Kakiuchi et al. |
| 7,019,351 | B2 | 3/2006 | Eppich et al. |
| 7,026,694 | B2 | 4/2006 | Ahn et al. |
| 7,030,042 | B2 | 4/2006 | Vaartstra et al. |
| 7,037,862 | B2 | 5/2006 | Ahn et al. |
| 7,041,609 | B2 | 5/2006 | Vaartstra |
| 7,045,430 | B2 | 5/2006 | Ahn et al. |
| 7,045,431 | B2 | 5/2006 | Rotondaro et al. |
| 7,049,192 | B2 | 5/2006 | Ahn et al. |
| 7,057,244 | B2 | 6/2006 | Andreoni et al. |
| 7,068,544 | B2 | 6/2006 | Forbes et al. |
| 7,077,902 | B2 | 7/2006 | Vaartstra |
| 7,081,421 | B2 | 7/2006 | Ahn et al. |
| 7,084,078 | B2 | 8/2006 | Ahn et al. |
| 7,091,119 | B2 | 8/2006 | Colombo |
| 7,101,813 | B2 | 9/2006 | Ahn et al. |
| 7,112,485 | B2 | 9/2006 | Vaartstra |
| 7,115,166 | B2 | 10/2006 | Vaartstra et al. |
| 7,115,528 | B2 | 10/2006 | Vaartstra et al. |
| 7,115,530 | B2 | 10/2006 | Quevedo-Lopez et al. |
| 7,122,409 | B2 | 10/2006 | Kawasaki et al. |
| 7,122,464 | B2 | 10/2006 | Vaartstra |
| 7,125,815 | B2 | 10/2006 | Vaartstra |
| 7,135,361 | B2 | 11/2006 | Visokay et al. |
| 7,135,369 | B2 | 11/2006 | Ahn et al. |
| 7,135,370 | B2 | 11/2006 | Baker |
| 7,135,421 | B2 | 11/2006 | Ahn et al. |
| 7,136,343 | B2 | 11/2006 | Inoue et al. |
| 7,141,278 | B2 | 11/2006 | Koh et al. |
| 7,141,288 | B2 | 11/2006 | Inoue et al. |
| 7,141,289 | B2 | 11/2006 | Inoue et al. |
| 7,144,825 | B2 | 12/2006 | Adetutu et al. |
| 7,148,546 | B2 | 12/2006 | Visokay et al. |
| 7,154,836 | B2 | 12/2006 | Inoue et al. |
| 7,157,128 | B2 | 1/2007 | Inoue et al. |
| 7,160,577 | B2 | 1/2007 | Ahn et al. |
| 7,160,597 | B2 | 1/2007 | Inoue et al. |
| 7,161,894 | B2 | 1/2007 | Judge |
| 7,166,347 | B2 | 1/2007 | Inoue et al. |
| 7,167,440 | B2 | 1/2007 | Inoue et al. |
| 7,176,076 | B2 | 2/2007 | Chambers et al. |
| 7,182,990 | B2 | 2/2007 | Inoue et al. |
| 7,195,999 | B2 | 3/2007 | Forbes et al. |
| 7,196,007 | B2 | 3/2007 | Vaartstra |
| 7,199,023 | B2 | 4/2007 | Ahn et al. |
| 7,208,793 | B2 | 4/2007 | Bhattacharyya |
| 7,211,492 | B2 | 5/2007 | Forbes et |
| 7,214,416 | B2 | 5/2007 | Nakai et al. |
| 7,214,994 | B2 | 5/2007 | Forbes et al. |
| 7,226,830 | B2 | 6/2007 | Colombo et al. |
| 7,235,501 | B2 | 6/2007 | Ahn et al. |
| 7,250,367 | B2 | 7/2007 | Vaartstra et al. |
| 7,253,122 | B2 | 8/2007 | Vaartstra |
| 7,271,077 | B2 | 9/2007 | Vaartstra et al. |
| 7,279,732 | B2 | 10/2007 | Meng et al. |

| | | | |
|---|---|---|---|
| 7,291,526 B2 | 11/2007 | Li | |
| 7,294,556 B2 | 11/2007 | Vaartstra | |
| 7,300,870 B2 | 11/2007 | Vaartstra | |
| 7,332,442 B2 | 2/2008 | Vaartstra et al. | |
| 7,368,402 B2 | 5/2008 | Vaartstra | |
| 7,374,617 B2 | 5/2008 | Vaartstra | |
| 7,396,719 B2 * | 7/2008 | Kim et al. | 438/240 |
| 7,410,910 B2 | 8/2008 | Ahn et al. | |
| 7,410,918 B2 | 8/2008 | Vaartstra | |
| 7,432,548 B2 | 10/2008 | Forbes et al. | |
| 7,531,869 B2 | 5/2009 | Ahn et al. | |
| 7,575,978 B2 | 8/2009 | Kraus et al. | |
| 7,605,030 B2 | 10/2009 | Forbes et al. | |
| 2001/0002280 A1 | 5/2001 | Sneh | |
| 2001/0005625 A1 | 6/2001 | Sun | |
| 2001/0009695 A1 | 7/2001 | Saanila et al. | |
| 2001/0014526 A1 | 8/2001 | Clevenger et al. | |
| 2001/0015441 A1 | 8/2001 | Kawasaki et al. | |
| 2001/0019876 A1 | 9/2001 | Juengling et al. | |
| 2001/0024387 A1 | 9/2001 | Raaijmakers et al. | |
| 2001/0030352 A1 | 10/2001 | Ruf et al. | |
| 2001/0031332 A1 | 10/2001 | Tominaga et al. | |
| 2001/0032995 A1 | 10/2001 | Maria et al. | |
| 2001/0034117 A1 | 10/2001 | Eldridge et al. | |
| 2001/0050438 A1 | 12/2001 | Juengling et al. | |
| 2001/0052752 A1 | 12/2001 | Ghosh et al. | |
| 2001/0053096 A1 | 12/2001 | Forbes et al. | |
| 2001/0053577 A1 | 12/2001 | Forbes et al. | |
| 2001/0054598 A1 | 12/2001 | Kashiwaya et al. | |
| 2002/0001219 A1 | 1/2002 | Forbes et al. | |
| 2002/0001971 A1 | 1/2002 | Cho | |
| 2002/0003403 A1 | 1/2002 | Ghosh et al. | |
| 2002/0004276 A1 | 1/2002 | Ahn et al. | |
| 2002/0004277 A1 | 1/2002 | Ahn et al. | |
| 2002/0019116 A1 | 2/2002 | Sandhu et al. | |
| 2002/0019125 A1 | 2/2002 | Juengling et al. | |
| 2002/0024080 A1 | 2/2002 | Derderian et al. | |
| 2002/0025628 A1 | 2/2002 | Derderian et al. | |
| 2002/0037603 A1 | 3/2002 | Eldridge et al. | |
| 2002/0046705 A1 | 4/2002 | Sandhu et al. | |
| 2002/0053869 A1 | 5/2002 | Ahn et al. | |
| 2002/0068466 A1 | 6/2002 | Lee et al. | |
| 2002/0072164 A1 | 6/2002 | Umotoy et al. | |
| 2002/0086507 A1 | 7/2002 | Park et al. | |
| 2002/0089023 A1 | 7/2002 | Yu et al. | |
| 2002/0094632 A1 | 7/2002 | Agarwal et al. | |
| 2002/0100418 A1 | 8/2002 | Sandhu et al. | |
| 2002/0102818 A1 | 8/2002 | Sandhu et al. | |
| 2002/0105087 A1 | 8/2002 | Forbes et al. | |
| 2002/0110991 A1 | 8/2002 | Li | |
| 2002/0111001 A1 | 8/2002 | Ahn | |
| 2002/0117704 A1 | 8/2002 | Gonzalez | |
| 2002/0121665 A1 | 9/2002 | Kawasaki et al. | |
| 2002/0122885 A1 | 9/2002 | Ahn | |
| 2002/0130378 A1 | 9/2002 | Forbes et al. | |
| 2002/0132374 A1 | 9/2002 | Basceri et al. | |
| 2002/0135048 A1 | 9/2002 | Ahn et al. | |
| 2002/0137330 A1 | 9/2002 | Ryan | |
| 2002/0145845 A1 | 10/2002 | Hunt et al. | |
| 2002/0145901 A1 | 10/2002 | Forbes et al. | |
| 2002/0146874 A1 | 10/2002 | Kawasaki et al. | |
| 2002/0146916 A1 | 10/2002 | Irino et al. | |
| 2002/0155688 A1 | 10/2002 | Ahn | |
| 2002/0155689 A1 | 10/2002 | Ahn | |
| 2002/0164420 A1 | 11/2002 | Derderian et al. | |
| 2002/0167057 A1 | 11/2002 | Ahn et al. | |
| 2002/0170671 A1 | 11/2002 | Matsushita et al. | |
| 2002/0175423 A1 | 11/2002 | Forbes et al. | |
| 2002/0176989 A1 | 11/2002 | Knudsen et al. | |
| 2002/0177244 A1 | 11/2002 | Hsu et al. | |
| 2002/0190294 A1 | 12/2002 | Iizuka et al. | |
| 2002/0192974 A1 | 12/2002 | Ahn et al. | |
| 2002/0192975 A1 | 12/2002 | Ahn | |
| 2002/0192979 A1 | 12/2002 | Ahn | |
| 2002/0195056 A1 | 12/2002 | Sandhu et al. | |
| 2003/0001241 A1 | 1/2003 | Chakrabarti et al. | |
| 2003/0003635 A1 | 1/2003 | Paranjpe et al. | |
| 2003/0003702 A1 | 1/2003 | Ahn | |
| 2003/0003722 A1 | 1/2003 | Vaartstra | |
| 2003/0003730 A1 | 1/2003 | Li | |
| 2003/0008235 A1 | 1/2003 | Inoue et al. | |
| 2003/0008243 A1 | 1/2003 | Ahn et al. | |
| 2003/0016619 A1 | 1/2003 | Judge et al. | |
| 2003/0017717 A1 | 1/2003 | Ahn | |
| 2003/0027360 A1 | 2/2003 | Hsu et al. | |
| 2003/0040196 A1 | 2/2003 | Lim et al. | |
| 2003/0043637 A1 | 3/2003 | Forbes et al. | |
| 2003/0045060 A1 | 3/2003 | Ahn et al. | |
| 2003/0045078 A1 | 3/2003 | Ahn et al. | |
| 2003/0049900 A1 | 3/2003 | Forbes et al. | |
| 2003/0049942 A1 | 3/2003 | Haukka et al. | |
| 2003/0059535 A1 | 3/2003 | Luo et al. | |
| 2003/0060146 A1 | 3/2003 | Kashiwaya et al. | |
| 2003/0064607 A1 | 4/2003 | Leu et al. | |
| 2003/0092213 A1 | 5/2003 | Yamazaki et al. | |
| 2003/0104666 A1 | 6/2003 | Bojarczuk, Jr. et al. | |
| 2003/0106490 A1 | 6/2003 | Jallepally et al. | |
| 2003/0111678 A1 | 6/2003 | Colombo et al. | |
| 2003/0119246 A1 | 6/2003 | Ahn | |
| 2003/0119291 A1 | 6/2003 | Ahn et al. | |
| 2003/0132491 A1 | 7/2003 | Ahn | |
| 2003/0137019 A1 | 7/2003 | Maria et al. | |
| 2003/0139039 A1 | 7/2003 | Ahn et al. | |
| 2003/0141560 A1 | 7/2003 | Sun | |
| 2003/0142569 A1 | 7/2003 | Forbes | |
| 2003/0157764 A1 | 8/2003 | Ahn et al. | |
| 2003/0172872 A1 | 9/2003 | Thakur et al. | |
| 2003/0173652 A1 | 9/2003 | Forbes et al. | |
| 2003/0173653 A1 | 9/2003 | Forbes et al. | |
| 2003/0174529 A1 | 9/2003 | Forbes et al. | |
| 2003/0175411 A1 | 9/2003 | Kodas et al. | |
| 2003/0176025 A1 | 9/2003 | Forbes et al. | |
| 2003/0176049 A1 | 9/2003 | Hegde et al. | |
| 2003/0176050 A1 | 9/2003 | Forbes et al. | |
| 2003/0176052 A1 | 9/2003 | Forbes et al. | |
| 2003/0176053 A1 | 9/2003 | Forbes et al. | |
| 2003/0176065 A1 | 9/2003 | Vaartstra | |
| 2003/0185980 A1 | 10/2003 | Endo | |
| 2003/0200917 A1 | 10/2003 | Vaartstra | |
| 2003/0207032 A1 | 11/2003 | Ahn et al. | |
| 2003/0207504 A1 | 11/2003 | Fuselier et al. | |
| 2003/0207540 A1 | 11/2003 | Ahn et al. | |
| 2003/0207566 A1 | 11/2003 | Forbes et al. | |
| 2003/0213987 A1 | 11/2003 | Basceri | |
| 2003/0216038 A1 | 11/2003 | Madhukar et al. | |
| 2003/0227033 A1 | 12/2003 | Ahn et al. | |
| 2003/0228747 A1 | 12/2003 | Ahn et al. | |
| 2003/0235134 A1 | 12/2003 | Inoue et al. | |
| 2003/0235961 A1 | 12/2003 | Metzner et al. | |
| 2004/0004247 A1 | 1/2004 | Forbes et al. | |
| 2004/0007171 A1 | 1/2004 | Ritala et al. | |
| 2004/0009678 A1 | 1/2004 | Asai et al. | |
| 2004/0009679 A1 | 1/2004 | Yeo et al. | |
| 2004/0016944 A1 | 1/2004 | Ahn et al. | |
| 2004/0023461 A1 | 2/2004 | Ahn et al. | |
| 2004/0023516 A1 | 2/2004 | Londergan et al. | |
| 2004/0027966 A1 | 2/2004 | Inoue et al. | |
| 2004/0028811 A1 | 2/2004 | Cho et al. | |
| 2004/0032812 A1 | 2/2004 | Inoue et al. | |
| 2004/0033661 A1 | 2/2004 | Yeo et al. | |
| 2004/0033681 A1 | 2/2004 | Ahn et al. | |
| 2004/0033701 A1 | 2/2004 | Ahn et al. | |
| 2004/0036129 A1 | 2/2004 | Forbes et al. | |
| 2004/0038554 A1 | 2/2004 | Ahn | |
| 2004/0040494 A1 | 3/2004 | Vaartstra et al. | |
| 2004/0040501 A1 | 3/2004 | Vaartstra | |
| 2004/0041192 A1 | 3/2004 | Baker | |
| 2004/0043151 A1 | 3/2004 | Vaartstra | |
| 2004/0043541 A1 | 3/2004 | Ahn et al. | |
| 2004/0043569 A1 | 3/2004 | Ahn et al. | |
| 2004/0043600 A1 | 3/2004 | Vaartstra | |
| 2004/0043604 A1 | 3/2004 | Vaartstra | |
| 2004/0043625 A1 | 3/2004 | Vaartstra et al. | |
| 2004/0043630 A1 | 3/2004 | Vaartstra et al. | |
| 2004/0043632 A1 | 3/2004 | Vaartstra | |
| 2004/0043633 A1 | 3/2004 | Vaartstra | |
| 2004/0043634 A1 | 3/2004 | Vaartstra | |
| 2004/0043635 A1 | 3/2004 | Vaartstra | |

| | | |
|---|---|---|
| 2004/0043636 A1 | 3/2004 | Vaartstra et al. |
| 2004/0065255 A1 | 4/2004 | Yang et al. |
| 2004/0070649 A1 | 4/2004 | Hess et al. |
| 2004/0087178 A1 | 5/2004 | Koyanagi et al. |
| 2004/0092061 A1 | 5/2004 | Kawasaki et al. |
| 2004/0092073 A1 | 5/2004 | Cabral, Jr. et al. |
| 2004/0094801 A1 | 5/2004 | Liang et al. |
| 2004/0104439 A1 | 6/2004 | Haukka et al. |
| 2004/0110348 A1 | 6/2004 | Ahn et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0135186 A1 | 7/2004 | Yamamoto |
| 2004/0140470 A1 | 7/2004 | Kawasaki et al. |
| 2004/0140513 A1 | 7/2004 | Forbes et al. |
| 2004/0142546 A1 | 7/2004 | Kudo et al. |
| 2004/0144980 A1 | 7/2004 | Ahn et al. |
| 2004/0145001 A1 | 7/2004 | Kanda et al. |
| 2004/0146805 A1 | 7/2004 | Kato et al. |
| 2004/0152254 A1 | 8/2004 | Vaartstra et al. |
| 2004/0157158 A1 | 8/2004 | Kakiuchi et al. |
| 2004/0161883 A1 | 8/2004 | Colombo et al. |
| 2004/0161899 A1 | 8/2004 | Luo et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0174804 A1 | 9/2004 | Kakiuchi et al. |
| 2004/0175882 A1 | 9/2004 | Ahn et al. |
| 2004/0178439 A1 | 9/2004 | Ahn et al. |
| 2004/0180171 A1 | 9/2004 | Takasaki et al. |
| 2004/0183108 A1 | 9/2004 | Ahn |
| 2004/0185630 A1 | 9/2004 | Forbes et al. |
| 2004/0185654 A1 | 9/2004 | Ahn |
| 2004/0187968 A1 | 9/2004 | Vaartstra |
| 2004/0188778 A1 | 9/2004 | Aoyama |
| 2004/0189175 A1 | 9/2004 | Ahn et al. |
| 2004/0190435 A1 | 9/2004 | Hosoda et al. |
| 2004/0191462 A1 | 9/2004 | Hosoda et al. |
| 2004/0191685 A1 | 9/2004 | Kakiuchi et al. |
| 2004/0191687 A1 | 9/2004 | Fukuzawa et al. |
| 2004/0191689 A1 | 9/2004 | Shingai et al. |
| 2004/0191997 A1 | 9/2004 | Kawahara et al. |
| 2004/0196620 A1 | 10/2004 | Knudsen et al. |
| 2004/0197946 A1 | 10/2004 | Vaartstra et al. |
| 2004/0198069 A1 | 10/2004 | Metzner et al. |
| 2004/0203254 A1 | 10/2004 | Conley, Jr. et al. |
| 2004/0208105 A1 | 10/2004 | Shingai et al. |
| 2004/0213124 A1 | 10/2004 | Shingai et al. |
| 2004/0214399 A1 | 10/2004 | Ahn et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0224527 A1 | 11/2004 | Sarigiannis et al. |
| 2004/0235313 A1 | 11/2004 | Frank et al. |
| 2004/0238904 A1 | 12/2004 | Colombo et al. |
| 2004/0241581 A1 | 12/2004 | Kakiuchi et al. |
| 2004/0248387 A1 | 12/2004 | Kawasaki et al. |
| 2004/0248398 A1 | 12/2004 | Ahn et al. |
| 2004/0262700 A1 | 12/2004 | Ahn et al. |
| 2004/0264236 A1 | 12/2004 | Chae et al. |
| 2004/0266217 A1 | 12/2004 | Kim et al. |
| 2005/0006727 A1 | 1/2005 | Forbes et al. |
| 2005/0007817 A1 | 1/2005 | Forbes et al. |
| 2005/0009266 A1 | 1/2005 | Vaartstra |
| 2005/0009335 A1 | 1/2005 | Dean et al. |
| 2005/0009358 A1 | 1/2005 | Choi et al. |
| 2005/0009368 A1 | 1/2005 | Vaartstra |
| 2005/0009370 A1 | 1/2005 | Ahn |
| 2005/0017327 A1 | 1/2005 | Forbes et al. |
| 2005/0018591 A1 | 1/2005 | Inoue et al. |
| 2005/0018592 A1 | 1/2005 | Inoue et al. |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0023650 A1 | 2/2005 | Forbes et al. |
| 2005/0024092 A1 | 2/2005 | Forbes |
| 2005/0026349 A1 | 2/2005 | Forbes et al. |
| 2005/0026458 A1 | 2/2005 | Basceri et al. |
| 2005/0028733 A1 | 2/2005 | Vaartstra |
| 2005/0029545 A1 | 2/2005 | Forbes et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0047301 A1 | 3/2005 | Inoue et al. |
| 2005/0047302 A1 | 3/2005 | Inoue et al. |
| 2005/0047303 A1 | 3/2005 | Inoue et al. |
| 2005/0047304 A1 | 3/2005 | Inoue et al. |
| 2005/0047305 A1 | 3/2005 | Inoue et al. |
| 2005/0047306 A1 | 3/2005 | Inoue et al. |
| 2005/0048249 A1 | 3/2005 | Inoue et al. |
| 2005/0051828 A1 | 3/2005 | Park et al. |
| 2005/0054165 A1 | 3/2005 | Ahn et al. |
| 2005/0059198 A1 | 3/2005 | Visokay et al. |
| 2005/0070062 A1 | 3/2005 | Visokay et al. |
| 2005/0070126 A1 | 3/2005 | Senzaki |
| 2005/0077519 A1 | 4/2005 | Ahn et al. |
| 2005/0079696 A1 | 4/2005 | Colombo |
| 2005/0085092 A1 | 4/2005 | Adetutu et al. |
| 2005/0087134 A1 | 4/2005 | Ahn |
| 2005/0106797 A1 | 5/2005 | Colombo |
| 2005/0112499 A1 | 5/2005 | Nakai et al. |
| 2005/0124109 A1 | 6/2005 | Quevedo-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0136689 A9 | 6/2005 | Vaartstra |
| 2005/0138262 A1 | 6/2005 | Forbes |
| 2005/0142324 A1 | 6/2005 | Hayashida et al. |
| 2005/0142776 A1 | 6/2005 | Shin |
| 2005/0145957 A1 | 7/2005 | Ahn et al. |
| 2005/0145959 A1 | 7/2005 | Forbes |
| 2005/0151184 A1 | 7/2005 | Lee et al. |
| 2005/0157549 A1 | 7/2005 | Mokhlesi et al. |
| 2005/0160981 A9 | 7/2005 | Vaartstra et al. |
| 2005/0164521 A1 | 7/2005 | Ahn et al. |
| 2005/0169054 A1 | 8/2005 | Forbes |
| 2005/0170208 A1 | 8/2005 | Yatsunami et al. |
| 2005/0173755 A1 | 8/2005 | Forbes |
| 2005/0181607 A1 | 8/2005 | Aoyama |
| 2005/0207308 A1 | 9/2005 | Kobayashi et al. |
| 2005/0217722 A1 | 10/2005 | Komatsu et al. |
| 2005/0218462 A1 | 10/2005 | Ahn et al. |
| 2005/0221006 A1 | 10/2005 | Vaartstra |
| 2005/0227442 A1 | 10/2005 | Ahn et al. |
| 2005/0233247 A1 | 10/2005 | Hosoda et al. |
| 2005/0242391 A1 | 11/2005 | She et al. |
| 2005/0243677 A1 | 11/2005 | Kobayashi et al. |
| 2005/0260347 A1 | 11/2005 | Narwankar et al. |
| 2005/0260357 A1 | 11/2005 | Olsen et al. |
| 2005/0263756 A1 | 12/2005 | Yatsunami et al. |
| 2005/0270963 A1 | 12/2005 | Mishima et al. |
| 2005/0271812 A1 | 12/2005 | Myo et al. |
| 2005/0271813 A1 | 12/2005 | Kher et al. |
| 2005/0277256 A1 | 12/2005 | Ahn et al. |
| 2005/0280067 A1 | 12/2005 | Ahn et al. |

| | | | | | | |
|---|---|---|---|---|---|---|
| 2005/0282329 | A1 | 12/2005 | Li | 2006/0280896 | A1 | 12/2006 | Kikukawa et al. |
| 2005/0285208 | A1 | 12/2005 | Ren et al. | 2006/0281330 | A1 | 12/2006 | Ahn et al. |
| 2005/0285225 | A1 | 12/2005 | Ahn et al. | 2006/0284220 | A1 | 12/2006 | Watanabe et al. |
| 2005/0285226 | A1 | 12/2005 | Lee | 2006/0289863 | A1 | 12/2006 | Iijima et al. |
| 2005/0287804 | A1 | 12/2005 | Vaartstra | 2006/0289895 | A1 | 12/2006 | Kamata |
| 2005/0287819 | A1 | 12/2005 | Vaartstra et al. | 2006/0292773 | A1 | 12/2006 | Goolsby et al. |
| 2006/0000412 | A1 | 1/2006 | Ahn et al. | 2006/0292788 | A1 | 12/2006 | Vaartstra |
| 2006/0001151 | A1 | 1/2006 | Ahn et al. | 2007/0006798 | A1 | 1/2007 | Vaartstra et al. |
| 2006/0003517 | A1 | 1/2006 | Ahn et al. | 2007/0007560 | A1 | 1/2007 | Forbes et al. |
| 2006/0003529 | A1 | 1/2006 | Baker | 2007/0007635 | A1 | 1/2007 | Forbes et al. |
| 2006/0008966 | A1 | 1/2006 | Forbes et al. | 2007/0010060 | A1 | 1/2007 | Forbes et al. |
| 2006/0019033 | A1 | 1/2006 | Muthukrishnan et al. | 2007/0010061 | A1 | 1/2007 | Forbes et al. |
| 2006/0023513 | A1 | 2/2006 | Forbes et al. | 2007/0018214 | A1 | 1/2007 | Ahn |
| 2006/0024975 | A1 | 2/2006 | Ahn et al. | 2007/0020835 | A1 | 1/2007 | Ahn et al. |
| 2006/0027882 | A1 | 2/2006 | Mokhlesi | 2007/0027882 | A1 | 2/2007 | Kulkarni |
| 2006/0028867 | A1 | 2/2006 | Forbes et al. | 2007/0030795 | A1 | 2/2007 | Kikuawa et al. |
| 2006/0028869 | A1 | 2/2006 | Forbes et al. | 2007/0037335 | A1 | 2/2007 | Chambers et al. |
| 2006/0033165 | A1 | 2/2006 | Chan et al. | 2007/0037415 | A1 | 2/2007 | Ahn et al. |
| 2006/0043367 | A1 | 3/2006 | Chang et al. | 2007/0045676 | A1 | 3/2007 | Forbes et al. |
| 2006/0043492 | A1 | 3/2006 | Ahn et al. | 2007/0045752 | A1 | 3/2007 | Forbes et al. |
| 2006/0043504 | A1 | 3/2006 | Ahn et al. | 2007/0048926 | A1 | 3/2007 | Ahn |
| 2006/0046505 | A1 | 3/2006 | Ahn et al. | 2007/0048989 | A1 | 3/2007 | Ahn et al. |
| 2006/0046521 | A1 | 3/2006 | Vaartstra et al. | 2007/0049023 | A1 | 3/2007 | Ahn et al. |
| 2006/0046522 | A1 | 3/2006 | Ahn et al. | 2007/0049051 | A1 | 3/2007 | Ahn et al. |
| 2006/0048711 | A1 | 3/2006 | Vaartstra | 2007/0049054 | A1 | 3/2007 | Ahn et al. |
| 2006/0054943 | A1 | 3/2006 | Li et al. | 2007/0059872 | A1 | 3/2007 | Visokay et al. |
| 2006/0062917 | A1 | 3/2006 | Muthukrishnan et al. | 2007/0059881 | A1 | 3/2007 | Ahn et al. |
| 2006/0081895 | A1 | 4/2006 | Lee et al. | 2007/0069241 | A1 | 3/2007 | Yang et al. |
| 2006/0084247 | A1 | 4/2006 | Liu | 2007/0087563 | A1 | 4/2007 | Ahn et al. |
| 2006/0086993 | A1 | 4/2006 | Suzuki et al. | 2007/0090439 | A1 | 4/2007 | Ahn et al. |
| 2006/0110870 | A1 | 5/2006 | Bhattacharyya | 2007/0090440 | A1 | 4/2007 | Ahn et al. |
| 2006/0118890 | A1 | 6/2006 | Li | 2007/0090441 | A1 | 4/2007 | Ahn et al. |
| 2006/0121744 | A1 | 6/2006 | Quevedo-Lopez et al. | 2007/0092989 | A1 | 4/2007 | Kraus et al. |
| 2006/0125030 | A1 | 6/2006 | Ahn et al. | 2007/0099366 | A1 | 5/2007 | Ahn et al. |
| 2006/0128168 | A1 | 6/2006 | Ahn et al. | 2007/0101929 | A1 | 5/2007 | Ahn et al. |
| 2006/0148180 | A1 | 7/2006 | Ahn et al. | 2007/0105313 | A1 | 5/2007 | Forbes |
| 2006/0153051 | A1 | 7/2006 | Kikukawa et al. | 2007/0107661 | A1 | 5/2007 | Ahn |
| 2006/0161942 | A1 | 7/2006 | Kikukawa et al. | 2007/0111544 | A1 | 5/2007 | Ahn |
| 2006/0166476 | A1 | 7/2006 | Lee et al. | 2007/0131169 | A1 | 6/2007 | Ahn |
| 2006/0170032 | A1 | 8/2006 | Bhattacharyya | 2007/0134931 | A1 | 6/2007 | Ahn et al. |
| 2006/0172485 | A1 | 8/2006 | Vaartstra | 2007/0134942 | A1 | 6/2007 | Ahn et al. |
| 2006/0176645 | A1 | 8/2006 | Ahn et al. | 2007/0141832 | A1 | 6/2007 | Farrar |
| 2006/0177975 | A1 | 8/2006 | Ahn et al. | 2007/0144438 | A1 | 6/2007 | Vaartstra |
| 2006/0183272 | A1 | 8/2006 | Ahn et al. | 2007/0145454 | A1 | 6/2007 | Bhattacharyya |
| 2006/0186458 | A1 | 8/2006 | Forbes et al. | 2007/0155190 | A1 | 7/2007 | Vaartstra et al. |
| 2006/0189154 | A1 | 8/2006 | Ahn et al. | 2007/0158765 | A1 | 7/2007 | Ahn et al. |
| 2006/0205132 | A1 | 9/2006 | Bhattacharyya | 2007/0161260 | A1 | 7/2007 | Vaartstra |
| 2006/0223248 | A1 | 10/2006 | Venugopal et al. | 2007/0166999 | A1 | 7/2007 | Vaartstra |
| 2006/0223337 | A1 | 10/2006 | Ahn et al. | 2007/0178643 | A1 | 8/2007 | Forbes et al. |
| 2006/0228868 | A1 | 10/2006 | Ahn et al. | 2007/0181931 | A1 | 8/2007 | Ahn et al. |
| 2006/0231017 | A1 | 10/2006 | Vaartstra | 2007/0187772 | A1 | 8/2007 | Ahn et al. |
| 2006/0237764 | A1 | 10/2006 | Ahn et al. | 2007/0187831 | A1 | 8/2007 | Ahn et al. |
| 2006/0244045 | A1 | 11/2006 | Visokay et al. | 2007/0234949 | A1 | 10/2007 | Ahn et al. |
| 2006/0244082 | A1 | 11/2006 | Ahn et al. | 2007/0295273 | A1 | 12/2007 | Vaartstra |
| 2006/0244100 | A1 | 11/2006 | Ahn et al. | 2008/0032424 | A1 | 2/2008 | Ahn et al. |
| 2006/0245339 | A1 | 11/2006 | Fukuzawa et al. | 2008/0032465 | A1 | 2/2008 | Ahn et al. |
| 2006/0245984 | A1 | 11/2006 | Kulkarni et al. | 2008/0054330 | A1 | 3/2008 | Forbes et al. |
| 2006/0246647 | A1 | 11/2006 | Visokay et al. | 2008/0057659 | A1 | 3/2008 | Forbes |
| 2006/0246651 | A1 | 11/2006 | Chambers et al. | 2008/0057690 | A1 | 3/2008 | Forbes |
| 2006/0246716 | A1 | 11/2006 | Colombo et al. | 2008/0064210 | A1 | 3/2008 | Vaartstra |
| 2006/0246741 | A1 | 11/2006 | Ahn et al. | 2008/0087945 | A1 | 4/2008 | Forbes et al. |
| 2006/0252211 | A1 | 11/2006 | Ahn et al. | 2008/0102629 | A1 | 5/2008 | Vaartstra |
| 2006/0252244 | A1 | 11/2006 | Vaartstra et al. | 2008/0121962 | A1 | 5/2008 | Forbes et al. |
| 2006/0252279 | A1 | 11/2006 | Vaartstra | 2008/0124907 | A1 | 5/2008 | Forbes et al. |
| 2006/0255470 | A1 | 11/2006 | Ahn et al. | 2008/0124908 | A1 | 5/2008 | Forbes et al. |
| 2006/0258097 | A1 | 11/2006 | Forbes et al. | 2008/0193791 | A1 | 8/2008 | Ahn et al. |
| 2006/0258175 | A1 | 11/2006 | Vaartstra et al. | 2008/0217676 | A1 | 9/2008 | Ahn et al. |
| 2006/0261376 | A1 | 11/2006 | Forbes et al. | 2009/0032910 | A1 | 2/2009 | Ahn et al. |
| 2006/0261389 | A1 | 11/2006 | Vaartstra | | | | |
| 2006/0261397 | A1 | 11/2006 | Ahn et al. | | | | |
| 2006/0263972 | A1 | 11/2006 | Ahn et al. | | | | |
| 2006/0263981 | A1 | 11/2006 | Forbes | | | | |
| 2006/0264064 | A1 | 11/2006 | Ahn et al. | | | | |
| 2006/0264066 | A1 | 11/2006 | Bartholomew et al. | | | | |
| 2006/0270147 | A1 | 11/2006 | Ahn et al. | | | | |
| 2006/0274580 | A1 | 12/2006 | Forbes | | | | |
| 2006/0275577 | A1 | 12/2006 | Nakai et al. | | | | |
| 2006/0278940 | A1 | 12/2006 | Kato et al. | | | | |
| 2006/0280895 | A1 | 12/2006 | Kikukawa et al. | | | | |

FOREIGN PATENT DOCUMENTS

| | | |
|---|---|---|
| WO | WO-0197257 A2 | 12/2001 |
| WO | WO-0231875 A2 | 4/2002 |
| WO | WO-2006026716 A1 | 3/2006 |

OTHER PUBLICATIONS

Chin, Albert, et al., "Device and reliability of high-K Al O gate dielectric. with good mobility and low D", *1999 Symposium on VLSI Technology Digest of Technical Papers*, (1999), 135-136.

Cho, H., et al., "Novel nitrogen profile engineering for improved TaN/HfO$_2$/Si MOSFET performance", *International Electron Devices Meeting, 2001. IEDM Technical Digest.*, (2001), 655-658.

Choi, Rino, et al., "High-Quality Ultra-thin HfO$_2$ Gate Dielectric MOSFETs with TaN Electrode and Nitridation Surface Properties", *2001 Symposium on VLSI Technology Digest of Technical Papers*, (2001), 15-16.

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998), 3 pages.

Conley, J. F, "Atomic Layer Deposition of Hafnium Oxide Using Anhydrous Hafnium Nitrate", *Electrochemical and Solid-State Letters*, 5(5), (May 2002), C57-C59.

Degrave, R, "Temperature Acceleration of oxide breakdown and its impact on ultra-thin gate oxide reliaility", *1999 Symposium on VLSI Technology Digest of Technical Papers*, (1999), 59-60.

Endo, Kazuhiko, "Metal Organic Atomic Layer Deposition of High-k Gate Dielectrics Using Plasma Oxidation", *Japanese Journal of Applied Physics*, 42, (2003), L685-L687.

Gealy, Daniel F, et al., "Graded Dielectric Layers", U.S. Appl. No. 11/216,542, filed Aug. 30, 2005.

Gusev, E. P., et al., "Ultrathin high-K gate stacks for advanced CMOS devices", *IEEE Tech. Dig. Int. Electron Devices*, (2001), 451-454.

Horwitz, J S, et al., "Pulsed laser deposition as a materials research tool", *Applied Surface Science*, 127-29, (May 1998), 507-513.

Hoshino, Y., et al., "Characterization and Control of the HfO$_2$/Si(001) Interfaces", *Applied Physics Letters*, 81, (Sep. 30, 2002), 2650-2652.

Inumiya, Seiji, et al., "Fabrication of HfSiON gate dielectrics by plasma oxidation and nitridation, optimized for 65 nm mode low power CMOS applications", *2003 Symposium on VLSI Technology Digest of Technical Papers*, (Jun. 10-12, 2003), 17-18.

Ishii, Hiroyuki, "Growth and electrical properties of atomic-layer deposited ZrO$_2$/Si-nitride stack gate dielectrics", *Journal of Applied Physics*, 95(2), (Jan. 15, 2004), 536-542.

Iwamoto, K., "Advanced Layer-By-Layer Deposition and Annealing Process for High-Quality High-K Dielectrics Formation", *Electrochemical Society Proceedings* vol. 2003 (14), (2003), 265-272.

Jeon, T. S., "Thermal Stabilitiy of ultrathin ZrO$_2$ films prpared by chemical vapor deposition of Si(100)", *Appl. Phys. Lett.*, 78(3), (Jan. 15, 2001), 368-370.

Jeong, Chang-Wook, et al., "Plasma-Assisted Atomic layer Growth of High-Quality Aluminum Oxide Thin Films", *Japanese Journal of Applied Physics*, 40 (Jan. 2001), 285-289.

Jonsson, A. K., "Dielectric Permittivity and Intercalation Parameters of Li Ion Intercalated Atomic Layer Deposited ZrO$_2$", *Journal of the Electrochemical Society*, vol. 151, No. 3, (2004), F54-F58.

Kim, Hyoungsub, et al., "Effects of crystallization on the electrical properties of ultrathin HfO$_2$ dielectrics grown by atomic layer deposition", *Applied Physics Letters*, vol. 82, No. 1, (Jan. 6, 2003), 106-108.

Kukli, Kaupo, "Atomic Layer Deposition of Titanium Oxide TiI$_4$ and H$_2$O$_2$," *Chemical Vapor Deposition*, 6(6), (2000), 303-310.

Kukli, Kaupo, "Low-Temperature Deposition of Zirconium Oxide-Based Nanocrystalline Films by Alternate Supply of Zr[OC(CH3)$_3$]$_4$ and H$_2$O", *Chemical Vapor Deposition*, 6(6), (2000), 297-302

Kukli, Kaupo, "Tailoring the dielectric properties of HfO$_2$-Ta2O$_3$ nanolaminates", *Appl. Phys. Lett.*, 68, (1996), 3737-3739.

Leskela, M, "ALD precursor chemistry: Evolution and future challenges", *Journal de Physique IV (Proceedings)*, 9(8), (Sep. 1999), 837-852

Lu, Xu-Bing, et al., "Structure and dielectric prioperties of amorphous LaAlO$_3$ and LaAlOxNy films as alternative gate dielectric materials", *Journal of Applied Physics*, 94(2), (Jul. 15, 2003), 1229-1234

Michaelson, Herbert B., "The work function of the elements and its periodicity", *Journal of Applied Physics*, 48(11), (Nov. 1977), 4729-4733.

Muller, D. A., et al., "The Electronic Structure at the Atomic Scale of Ultrathin Gate Oxides", *Nature*, 399, (Jun. 1999), 758-761.

Nalwa, H. S, "Handbook of Thin Film Materials", *Deposition and Processing of Thin Films*, vol. 1, San Diego : Academic Press, (2002), 114-119.

Nam, Seok-Woo, "Study of ZrO$_2$ thin films for gate oxide applications", *Journal of Vacuum Science & Technology A: Vacuum, Surfaces, and Films*, 19(4), (Jul. 2001), 1720-1724.

Nieh, R, et al., "Evaluation of Silicon Surface Nitridation Effects on Ultra-thin ZrO$_2$ GateDielectrics", *Applied Physics Letters*, 81(9), (Aug. 26, 2002), 1663-1665.

Packan, Paul A, "Pushing the Limits", *Science*, 285(5436), (Sep. 1999), 2079-2081.

Ritala, M., "Atomic layer deposition of oxide thin films with metal alkoxides as oxygen sources", *Science*, 288(5464), (Apr. 14, 2000), 319-321.

Robertson, J., "Band offsets of wide-band-gap oxides and implications for future electronic devices", *Journal of Vacuum Science & Technology B (Microelectronics and Nanometer Structures)*, 18(3), (May-Jun. 2000), 1785-1791.

Shanware, A., et al., "Characterization and comparison of the charge trapping in HfSiON and HfO$_2$ gate dielectrics", *IEEE International Electron Devices Meeting, 2003. IEDM '03 Technical Digest.*, (Dec. 8-10, 2003), 38.6.1-38.6.4.

Shin, Chang Ho, "Fabrication and Characterization of MFISFET Using Al$_2$O$_3$ Insulating Layer for Non-volatile Memory", *12th International Symposium in Integrated Ferroelectrics*, (Mar. 2000), 9 pages.

* cited by examiner

US 8,084,370 B2

HAFNIUM TANTALUM OXYNITRIDE DIELECTRIC

RELATED APPLICATIONS

This application is a divisional of U.S. application Ser. No. 11/515,114 filed Aug. 31, 2006, now U.S. Pat. No. 7,605,030, which is incorporated herein by reference in its entirety.

This application is related to the and commonly assigned applications U.S. application Ser. No. 10/229,903, entitled "ATOMIC LAYER DEPOSITED HfSiON DIELECTRIC FILMS," filed on 28 Aug. 2002, now issued as U.S. Pat. No. 7,199,023; U.S. application Ser. No. 11/216,474, entitled "LANTHANUM ALUMINUM OXYNITRIDE DIELECTRIC FILMS," filed on 31 Aug. 2005, now issued as U.S. Pat. No. 7,410,910, U.S. application Ser. No. 11/355,490, entitled "CONDUCTIVE LAYERS FOR HAFNIUM SILICON OXYNITRIDE FILMS," filed on 16 Feb. 2006; U.S. application Ser. No. 11/010,529, entitled "ATOMIC LAYER DEPOSITED LANTHANUM HAFNIUM OXIDE DIELECTRICS," filed on 13 Dec. 2004, now issued as U.S. Pat. No. 7,235,501, U.S. application Ser. No. 10/352,507, entitled "ATOMIC LAYER DEPOSITION OF METAL OXYNITRIDE LAYERS AS GATE DIELECTRICS AND SEMICONDUCTOR DEVICE STRUCTURES UTILIZING METAL OXYNITRIDE LAYER," filed on 27 Jan. 2003, U.S. patent application Ser. No. 11/029,757, entitled "ATOMIC LAYER DEPOSITED HAFNIUM TANTALUM OXIDE DIELECTRICS," filed on 5 Jan. 2005, now issued as U.S. Pat. No. 7,560,395, U.S. patent application Ser. No. 11/176,738, entitled "METAL-SUBSTITUTED TRANSISTOR GATES," filed on 7 Jul. 2005, now issued as U.S. Pat. No. 7,195,999, and U.S. patent application Ser. No. 11/216,375, entitled "SELF ALIGNED METAL GATES ON HIGH-K DIELECTRICS," filed 31 Aug. 2005, now issued as U.S. Pat. No. 7,211,492, which applications are incorporated herein by reference.

This application is also related to the co-pending and commonly assigned applications U.S. application Ser. No. 11/514,655, entitled "ATOMIC LAYER DEPOSITED TANTALUM ALUMINUM OXYNITRIDE FILMS", U.S. application Ser. No. 11/514,533, entitled "ATOMIC LAYER DEPOSITED SILICON LANTHANIDE OXYNITRIDE FILMS", now issued as U.S. Pat. No. 7,432,548, U.S. application Ser. No. 11/514,601, entitled "TANTALUM SILICON OXYNITRIDE HIGH-K DIELECTRICS AND METAL GATES", U.S. application Ser. No. 11/514,545, entitled "ATOMIC LAYER DEPOSITED TANTALUM LANTHANIDE OXYNITRIDE FILMS", now issued as U.S. Pat. No. 7,544,604, U.S. application Ser. No. 11/498,578, entitled "DEPOSITION OF ZrAlON FILMS", and U.S. application Ser. No. 11/514,558 entitled "HAFNIUM ALUMINIUM OXYNITRIDE HIGH-K DIELECTRIC AND METAL GATES", which patent applications are incorporated herein by reference.

TECHNICAL FIELD

This document relates generally to semiconductor devices and device fabrication, including devices having a high-κ dielectric.

BACKGROUND

The semiconductor device industry has a market-driven need to reduce the size of devices used in products such as processor chips, mobile telephones, and memory devices such as dynamic random access memories (DRAMs). Currently, the semiconductor industry relies on the ability to reduce or scale the dimensions of its basic devices. This includes scaling a dielectric layer in devices such as capacitors and silicon-based metal oxide semiconductor field effect transistors (MOSFETs), which have primarily been fabricated using silicon dioxide. Thermally-grown $SiO_2$ provides an electrically and thermodynamically stable material, where the interface of the $SiO_2$ layer with underlying silicon provides a high quality interface as well as desirable electrical isolation properties. However, increased scaling in microelectronic devices has made the use of $SiO_2$ less useful because of its band gap behavior and the resulting possibility of shorting.

DETAILED DESCRIPTION

Figure 1:
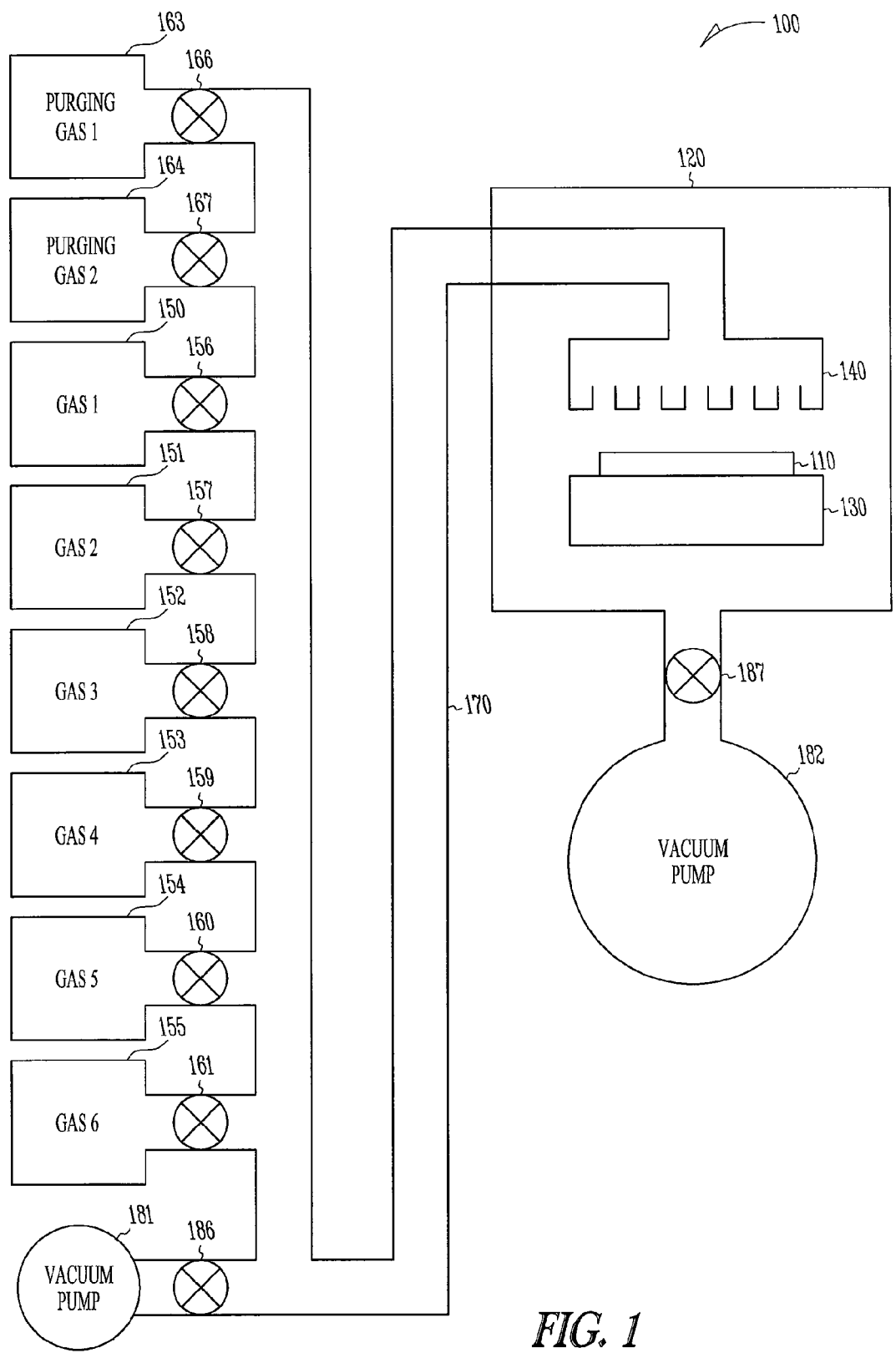
FIG. 1 depicts an embodiment of an atomic layer deposition system for processing a hafnium tantalum oxynitride film according to various embodiments of the invention.

To scale a dielectric region to reduce feature sizes and to provide higher density electronic devices, the dielectric region may have a reduced equivalent oxide thickness ($t_{eq}$). The equivalent oxide thickness quantifies the electrical properties, such as capacitance, of a dielectric in terms of a representative physical thickness. $T_{eq}$ is defined as the thickness of a theoretical $SiO_2$ layer that would be required to have the same capacitance density as a given dielectric, ignoring leakage current and reliability considerations.

A $SiO_2$ layer of thickness t, deposited on a silicon surface may have a $t_{eq}$ larger than its thickness t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. Thus, designs for future devices may be directed towards a physical $SiO_2$ dielectric layer of about 5 Å or less. Such a reduced thickness in a $SiO_2$ oxide layer creates additional problems.

$SiO_2$ is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers may not form a full band gap. The lack of a full band gap in a $SiO_2$ dielectric may cause an effective short between an underlying electrode and an overlying electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ may be considered for use as a dielectric region in such future devices.

In many cases, for a typical dielectric layer, the capacitance is determined as for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})\,t_{eq}=(\kappa/3.9)\,t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternative dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The reduced equivalent oxide thickness required for lower device operating voltages and smaller device dimensions may be realized by a significant number of materials, but additional fabricating requirements make determining a suitable replacement for $SiO_2$ difficult. For example, silicon-based devices may employ a dielectric material grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric, and the barrier layer prevents the formation of a $SiO_2$ layer, the $t_{eq}$ would be limited by the layer with the lowest dielectric constant. However, whether a single dielectric layer with a high dielectric constant or a barrier layer with a dielectric constant greater than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric tends to reduce leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Materials having a high dielectric constant relative to $SiO_2$ may also have a crystalline form, at least in a bulk configuration. Good candidates for replacing $SiO_2$ as a dielectric in a device are those that can be fabricated as a thin layer with an amorphous form and that have high dielectric constants.

Capacitor applications have used high-$\kappa$ dielectric materials, which are insulating materials having a dielectric constant greater than silicon dioxide. Such high-$\kappa$ dielectric materials include silicon oxynitride (SiON, $\kappa$~6), alumina ($Al_2O_3$, $\kappa$~9), and oxide/nitride composites ($SiO_2/Si_3N_4$, $\kappa$~6). Other possible candidates include metal oxides ($\kappa$~8-80), nitrides ($\kappa$~7-30), oxynitrides ($\kappa$~6-25), silicates ($\kappa$~6-20), carbides ($\kappa$~6-15), and complex titanates ($\kappa$~>100). Factors for selecting appropriate materials include physical, chemical and thermal stability as well as etch-ability and stoichiometric reproducibility. In field effect transistor (FET) applications, there are other factors to consider while addressing device scalability. The selected dielectric should provide stable amorphous and adherent films in the thickness range of 1 nm to 100 nm at temperatures ranging from room temperature to 1000° C. A relatively defect-free composition that is uniform and reproducible with a fixed charge density and trap density of less than $10^{11}$ cm$^{-2}$ in films of such composition is a factor. Another factor includes dielectric materials that provide a stable non-reactive interface with a silicon substrate such that the interface has an interface state density much less than $10^{11}$ cm$^{-2}$. Such interface state densities may occur when silicon bonds at the interface are saturated with high strength covalent bonds with molecular elements of the dielectric material. Yet another factor deals with current transport through the dielectric that should be controlled by tunneling, which is independent of temperature, rather than by trap-assisted thermally dependent transport. The conductivity of the dielectric should be equal to or lower than $SiO_2$ films when voltage is stressed to a field strength of $5\times10^6$ V/cm. To address current transport requirements, a dielectric material having a bandgap greater than 5 eV and having an electron and hole barrier height greater than 2 eV at a silicon interface may be considered. An additional factor to consider is using dielectric materials with a destructive breakdown strength greater than $6\times10^6$ V/cm. Other factors for selecting a dielectric material for use in a variety of electronic devices, such as for the dielectric in FETs, relates to processing characteristics. Such processing characteristics include compatibility with gate material, selective etch-ability, chemical inertness to contaminants, dopant and post processing environments (temperature, pressure, ambients), and intrinsic properties associated with annealing of defects/damages caused by post-processing such as ion-implantation, plasma-radiation, and gate/back-end processing.

In various embodiments, mixed metal oxynitrides are constructed as dielectric films in a variety of electronic devices and systems. Most oxynitrides are thermally stable and can integrate into semiconductor device processing. With nitrogen concentration in an oxynitride film at 30% or higher, such oxynitrides are considered chemically inert. With processing conditions controlled to provide very low partial pressures of hydrogen and ON ions, oxynitride films with a wide range of nitrogen to oxygen ratio can be deposited over a silicon substrate with very low fixed charge and interface states density. On the other hand, charge trapping and transport characteristics are dependent on the relative ratio of nitrogen to oxygen content in the constructed film. Films with nitrogen concentration twice that of oxygen (for example, approximately 40 atomic percent nitrogen, approximately 20 atomic percent oxygen, and approximately 40 atomic percent metal or silicon) have a lower bandgap, higher trap density, and transport characteristics dominated by Frenkel-Poole conduction. Such materials may not be well-suited for gate dielectric applications. However, such films also exhibit higher $\kappa$ values. With increasing oxygen concentration in oxynitride films, the bandgap is raised, current leakage is reduced, and the low frequency $\kappa$ value is also somewhat reduced. In addition with increasing oxygen concentration, the trap density is reduced, the trap energy depth is increased, and the carrier transport ceases to be trap-assisted, exhibits tunneling conduction, with a weakened temperature dependence. In various embodiments, a dielectric layer includes an oxynitride film having approximately 30 atomic % oxygen and approximately 30-35 atomic % nitrogen. With high enough nitrogen content, oxygen-vacancy induced defects in films may be negligible when compared with metal oxides.

Silicon oxynitride (SiON) may be used as a gate dielectric and gate insulator for a non-volatile FET device. Silicon oxynitride at a composition range of $Si_2ON_2$ exhibits a dielectric constant of 6.5 and a bandgap of approximately 6.5 eV compared to a stoichiometric nitride of $\kappa=7.5$ and a bandgap of 5.1 eV. Aluminum oxynitride (AlON) is expected to have a bandgap greater than 5 eV with a $\kappa$ value similar to SiON. Compared to SiON, metal oxynitrides such as ZrON, HfON, LaON, and TaON and other single metal oxynitrides are expected to have a lower bandgap. In various embodiments, bimetal (or metal/silicon) oxynitrides based on Si, Al, Hf, La, and Ta are used as dielectric films in a variety of electronic devices and systems. These bimetal oxynitrides may provide a bandgap range from 5 eV to greater than 7 eV. Estimates for bandgaps include a bandgap of Si—Al—ON of greater than 7 eV, a bandgap of Si—Hf—ON of about 6.9 eV, a bandgap of Al—Hf—ON of about 6.8 eV, a bandgap of Si—Ta—ON of about 6 eV, a bandgap of Al—Ta—ON of about 6 eV. Bimetal oxynitrides Hf—Ta—ON, Hf—La—ON, Al—La—ON, Ta—La—ON, and Si—La—ON are estimated to exhibit significantly lower bandgaps. The $\kappa$ value for Si—Al—ON is estimated at approximately 7 to 8, while the $\kappa$ values for the other oxynitrides of this group are estimated to be in the range from about 15 to 25. Refractory metals such as tungsten, molybdenum, tantalum, niobium, chromium, vanadium, and rhenium are metals with a melting point significantly higher than non-refractory metals. Transition metals are typically considered any element with an incomplete d subshell and include generally those elements between the group 2 elements and group 13 elements of the periodic table. Examples of transition metals include hafnium, yttrium, zirconium, platinum as well as the refractory metals. In various embodiments a refractory metal and a non-refractory metal are used to form a dielectric. In some embodiments a refractory metal and a non-refractory metal are used in combination with oxygen and nitrogen to form a dielectric. In various embodiments combinations of a refractory oxide, a refractory nitride and a refractory oxynitride form a dielectric. In some embodiments the refractory-based dielectric is amorphous. In some embodiments, the refractory-based dielectric is homogenous.

In some embodiments a refractory metal and a non-refractory transition metal form a dielectric. Various embodiments may include using a refractory metal and a non-refractory transition metal to form a plurality of layers. In some embodiments, stacked dielectric layers are formed using a refractory metal and a non-refractory transition metal in combination with oxygen and/or nitrogen. Various embodiments include forming a stacked dielectric structure using refractory metal oxides, refractory metal nitrides, refractory metal oxynitrides in combination with non-refractory metal oxides, non-refractory metal nitrides, and non-refractory metal oxynitrides. In some embodiments forming a stacked dielectric structure using refractory metal oxides, refractory metal nitrides, refractory metal oxynitrides in combination with non-refractory transition metal oxides, non-refractory transition metal nitrides, and non-refractory transition metal oxynitrides. In an embodiment, one or more of the refractory metal, non-refractory metal, oxygen and nitrogen concentration is graded substantially perpendicular to direction of deposition or to a surface normal. In an embodiment, one or more of the refractory metal, non-refractory metal, oxygen and nitrogen concentration is graded substantially parallel to direction of deposition or substantially parallel to the surface of the substrate.

In an embodiment, a film of hafnium tantalum oxynitride is used as a dielectric layer for application in a variety of electronic devices, replacing the use of silicon oxide to provide a higher dielectric constant. According to various embodiments, a high-$\kappa$ gate dielectric includes one or more of the following: TaN, HfN, HfON, TaON, HfTaON, TaN/HfN, TaN/HfON, TaON/HfN, TaON/HfON, TaN/HfO$_2$, Ta$_2$O$_5$/HfN, TaON/HfO$_2$, Ta$_2$O$_5$/HfON, and Ta$_2$O$_5$/HfO$_2$. In various embodiments, a dielectric layer is constructed containing hafnium tantalum oxynitride formed using atomic layer deposition with a metal electrode formed in contact with the dielectric layer. The metal electrode may also be formed by atomic layer deposition. The metal electrode may be formed by substituting a desired metal material for a previously disposed substitutable material. The metal electrode may be formed as a self aligned metal electrode on and contacting the dielectric layer. The metal electrode may be formed on the dielectric layer using a previously disposed sacrificial carbon layer on the dielectric layer and sacrificial carbon sidewall spacers adjacent to the sacrificial carbon layer.

The term hafnium tantalum oxynitride is used herein with respect to a composition that essentially consists of hafnium, tantalum, oxygen, and nitrogen in a form that may be stoichiometric, non-stoichiometric, or a combination of stoichiometric and non-stoichiometric. A hafnium tantalum oxynitride film may also be referred to as a hafnium tantalum oxygen nitrogen film. Other nomenclature for a composition that essentially consists of hafnium, tantalum, oxygen, and nitrogen may be known to those skilled in the art. In an embodiment, hafnium tantalum oxynitride may be formed substantially as a stoichiometric hafnium tantalum oxynitride film. In an embodiment, hafnium tantalum oxynitride may be formed substantially as a non-stoichiometric hafnium tantalum oxynitride film. In an embodiment, hafnium tantalum oxynitride may be formed substantially as a combination film of non-stoichiometric hafnium tantalum oxynitride and stoichiometric hafnium tantalum oxynitride. Herein, a hafnium tantalum oxynitride composition may be expressed as $Hf_xTaON$, $Hf_xTa_yO_zN_w$, or other equivalent form. The expression HfTaON or its equivalent forms may be used to include HfTaON in a form that is stoichiometric, non-stoichiometric, or a combination of stoichiometric and non-stoichiometric hafnium tantalum oxynitride. The expression HfTaON or its equivalent forms may be used to include HfTaON in a form that is homogeneous and amorphous hafnium tantalum oxynitride. The expressions TaO, $Ta_yO_z$, or its equivalent forms may be used to include tantalum oxide in a form that is stoichiometric, non-stoichiometric, or a combination of stoichiometric and non-stoichiometric. With respect to forms that are stoichiometric, non-stoichiometric, or a combination of stoichiometric and non-stoichiometric, expressions such as TaO, TaN, TaON, $Ta_yO_z$, $HfO_z$, $HfN_w$, HfON, $Hf_xO_zN_w$, etc. may be used. In some embodiments, x, y, w, and z are atomic mole fractions. In various embodiments, x, y, w, and z are atomic percentages. In some embodiments, x, y, w and z represent a particular chemical composition as is known in the art. Forms that are stoichiometric, non-stoichiometric, or a combination of stoichiometric and non-stoichiometric, may include expressions such as TaN, HfN, HfON, TaON, HfTaON, TaN/HfN, TaN/HfON, TaON/HfN, TaON/HfON, TaN/HfO$_2$, Ta$_2$O$_5$/HfN, TaON/HfO$_2$, Ta$_2$O$_5$/HfON, and Ta$_2$O$_5$/HfO$_2$. In various embodiments, a hafnium tantalum oxynitride film is doped with elements or compounds other than hafnium, tantalum, oxygen, and nitrogen.

Atomic Layer Deposition

In an embodiment, a hafnium tantalum oxynitride dielectric film may be formed using atomic layer deposition (ALD). Forming such structures using atomic layer deposition may allow control of transitions between material layers. As a result of such control, atomic layer deposited hafnium tantalum oxynitride dielectric films can have an engineered transition with a surface on which it is formed.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors absorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may be heated inside the atomic layer deposition system and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate may be followed by an inert gas pulse to remove excess precursor and by-products from the reaction chamber prior to pulsing the next precursor of the fabrication sequence.

Using RS-ALD, films can be layered in equal metered sequences that may all be substantially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to ALD material formation based on an ALD reaction of a precursor with its reactant precursor. For example, forming hafnium nitride from a $HfCl_4$ precursor and $NH_3$, as its reactant precursor, includes a hafnium/nitrogen sequence. In various ALD processes that form a nitride or a composition that contains nitrogen, a reactant precursor that contains nitrogen is used to supply nitrogen. Herein, a precursor that contains nitrogen and that supplies nitrogen to be incorporated in the ALD composition formed, which may be used in an ALD process with precursors supplying the other elements in the ALD composition, is referred to as a nitrogen reactant precursor. In the above example, $NH_3$ is a nitrogen reactant precursor. Similarly, an ALD sequence for a metal oxide may be referenced with respect to the metal and oxygen. For example, an ALD sequence for hafnium oxide may also be referred to as a hafnium/oxygen sequence. In various ALD processes that form an oxide or a composition that contains oxygen, a reactant precursor that contains oxygen is used to supply the oxygen. Herein, a precursor that contains oxygen and that supplies oxygen to be incorporated in the ALD composition formed, which may be used in an ALD process with precursors supplying the other elements in the ALD composition, is referred to as an oxygen reactant precursor. With an ALD process using $HfCl_4$ and water vapor to form hafnium oxide, water vapor is an oxygen reactant precursor. An ALD cycle may include pulsing a precursor, pulsing a purging gas for the precursor, pulsing a reactant precursor, and pulsing the reactant precursor's purging gas. An ALD cycle may include pulsing a precursor, evacuating the reactant chamber, pulsing a reactant precursor, and evacuating the reactant chamber. An ALD cycle may include pulsing a precursor, pulsing a purging gas for the precursor and evacuating the reactant chamber, pulsing a reactant precursor, and pulsing the reactant precursor's purging gas and evacuating the reactant chamber.

For example, forming tantalum oxide from a $TaCl_5$ precursor and $H_2O$, as its reactant precursor, forms an embodiment of a tantalum/oxygen sequence, which can also be referred to as a tantalum sequence. Additional information regarding tantalum oxides formed by ALD can be found in U.S. patent application Ser. No. 11/029,757, referenced previously.

In forming a layer of a metal species, an ALD sequence may deal with pulsing a reactant precursor to the substrate surface on which a metal-containing species has been absorbed such that the reactant precursor reacts with the metal-containing species resulting in the deposited metal and a gaseous by-product that can be removed during the subsequent purging/evacuating process. Alternatively, in forming a layer of a metal species, an ALD sequence may include reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a composition having more than two elements, a cycle may include a number of sequences to provide the elements of the composition. For example, a cycle for an ALD formation of an $ABO_x$ composition, where "A" is a first element, e.g., a metal, and "B" is a second element, e.g., a metal, may include sequentially [pulsing a first precursor/a purging gas for the first precursor/a first reactant precursor/ the first reactant precursor's purging gas] followed sequentially by [a second precursor/a purging gas for the second precursor/a second reactant precursor/the second reactant precursor's purging gas], which may be viewed as a cycle having two sequences. In an embodiment, a cycle may include a number of sequences for element A and a different number of sequences for element B. There may be cases in which ALD formation of an $ABO_x$ composition uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the composition. In an embodiment, a cycle for an ALD formation of the quaternary composition, hafnium tantalum oxygen nitrogen, may include sequentially [pulsing a first precursor/a purging gas for the first precursor/a first reactant precursor/the first reactant precursor's purging gas] followed sequentially by [a second precursor/a purging gas for the second precursor/a second reactant precursor/the second reactant precursor's purging gas/a third precursor/a purging gas for the third precursor/a third reactant precursor/ the third reactant precursor's purging gas], which may be viewed as a cycle having three sequences. In an embodiment, a layer substantially of a hafnium tantalum oxynitride composition is formed on a substrate mounted in a reaction chamber using ALD in repetitive tantalum/oxygen and hafnium/ nitrogen sequences using precursor gases individually pulsed into the reaction chamber. In an embodiment, a layer substantially of a hafnium tantalum oxynitride composition is formed on a substrate mounted in a reaction chamber using ALD in repetitive tantalum/nitrogen and hafnium/oxygen sequences using precursor gases individually pulsed into the reaction chamber. In an embodiment, a substantially hafnium tantalum oxynitride composition is formed by ALD having approximately 30% nitrogen and 30% oxygen concentrations in the resultant HfTaON dielectric film. In some embodiments, a substantially pure hafnium tantalum oxynitride composition is formed by ALD having approximately 20-40% nitrogen and 20-40% oxygen concentrations in the resultant HfTaON dielectric film.

FIG. 1 depicts an embodiment of an atomic layer deposition system 100 for processing a hafnium tantalum oxynitride according to various embodiments of the invention. The elements depicted are used to discuss various embodiments for forming HfTaON such that those skilled in the art may practice the present invention without undue experimentation. A substrate 110 is located inside a reaction chamber 120 of ALD system 100. Within reaction chamber 120 may be located a heating element 130, which is thermally coupled to substrate 110 to control the substrate temperature. A gas-distribution fixture 140 introduces precursor gases to the substrate 110. Each precursor gas originates from individual gas sources 150-155 whose flow is controlled by gas controllers 156-161, respectively. Examples of gas controllers include flow switches such as mass-flow controllers, ultrasound meters, and rotameters. Gas sources 150-155 provide a precursor gas either by storing the precursor as a gas or by providing a location and apparatus for evaporating a solid or liquid material to form the selected precursor gas. Furthermore, additional gas sources may be included, one or more for each metal precursor employed and one or more for each reactant precursor associated with each metal precursor, if desired.

Also included in the ALD system may be purging gas sources 163, 164, each of which is coupled to gas controllers 166, 167, respectively. Furthermore, additional purging gas sources may be constructed in ALD system 100, one purging gas source for each precursor gas. For a process that uses the same purging gas for multiple precursor gases, less purging gas sources are required for ALD system 100. Gas sources 150-155 and purging gas sources 163-164 are coupled by their associated gas controllers to a common gas line or conduit 170, which is coupled to the gas-distribution fixture 140 inside reaction chamber 120. Gas conduit 170 is also coupled to vacuum pump, or exhaust pump, 181 by gas controller 186 to remove excess precursor gases, purging gases, and by-product gases at the end of a purging sequence from gas conduit 170.

The vacuum pump, or exhaust pump, 182 may be coupled to chamber 120 using gas controller 187 to remove excess precursor gases, purging gases, and by-product gases at the end of a purging sequence from reaction chamber 120. For convenience, and to avoid obscuring various elements in the figure, control displays, mounting apparatus, temperature sensing devices, substrate maneuvering apparatus, and necessary electrical connections known to those skilled in the art are not shown in FIG. 1. The use, construction and fundamental operation of reaction chambers for deposition of films are understood by those of ordinary skill in the art of semiconductor fabrication. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading this disclosure.

In an embodiment, a hafnium tantalum oxynitride layer is structured as one or more monolayers with a thickness ranging from a monolayer to thousands of angstroms or more. The film may be processed using atomic layer deposition. Embodiments of an atomic layer deposited hafnium tantalum oxynitride layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

Prior to forming the hafnium tantalum oxynitride film using ALD, the surface on which the hafnium tantalum oxynitride film is to be deposited may undergo a preparation stage. The surface may be the surface of a substrate for an integrated circuit. In an embodiment, the substrate used for forming a transistor may include a silicon or silicon containing material. In other embodiments, silicon germanium, germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon-based substrate and a hafnium tantalum oxynitride dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer may improve the interface density, fixed charge density, and channel mobility of a device having this interface layer.

The sequencing of the formation of the regions of an electronic device, such as a transistor, may follow sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, an unmasked region includes a body region of a transistor; however, one skilled in the art will recognize that other semiconductor device structures may utilize this process.

In various embodiments, between each pulsing of a precursor used in an atomic layer deposition process, a purging gas is pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

In an embodiment, an ALD cycle for forming HfTaON includes sequencing component-containing precursors in the order of tantalum, oxygen, hafnium, and nitrogen with appropriate purging between the different component-containing precursors. Full coverage or partial coverage of a monolayer on a substrate surface may be attained for pulsing of a metal-containing precursor. In an embodiment, an ALD cycle for forming HfTaON includes sequencing the component-containing precursors in various permutations. In an embodiment, an ALD cycle to form hafnium tantalum oxynitride includes a number, x, of tantalum/oxygen sequences and a number, y, of hafnium/nitrogen sequences. In an embodiment, an ALD cycle to form hafnium tantalum oxynitride includes a number, x, of tantalum/nitrogen sequences and a number, y, of hafnium/oxygen sequences. In an embodiment, the number of sequences x and y is determined by selecting the relative amounts of hafnium, tantalum, oxygen, and nitrogen. In an embodiment, the number of sequences x and y may be selected to form hafnium tantalum oxynitride that is a nitrogen-rich relative to the amount of oxygen in the dielectric. In an embodiment, the number of sequences x and y may be selected to form hafnium tantalum oxynitride that is oxygen-rich relative to the amount of nitrogen in the dielectric. The hafnium tantalum oxynitride may be formed as a tantalum-rich dielectric relative to the amount of hafnium in the dielectric. The hafnium tantalum oxynitride may be formed as a hafnium-rich dielectric relative to the amount of tantalum in the dielectric. The pulsing of the individual component-containing precursors may be performed independently in a non-overlapping manner using the individual gas sources 150-155 and flow controllers 156-161 of ALD system 100 of FIG. 1.

Each precursor may be pulsed into the reaction chamber 120 for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber 120 maintained at a selected pressure independently for pulsing each precursor. Appropriate temperatures and pressures may be maintained, whether the precursor is a single precursor or a mixture of precursors.

A number of precursors containing tantalum may be used to provide the tantalum to a substrate for an integrated circuit. In an embodiment, a precursor containing a tantalum includes, but is not limited to $TaCl_5$, $(Ta(N-t-C_5H_{11})[N(CH_3)_2]_3$, and tantalum ethoxide $Ta(OC_2H_5)_5$. In an embodiment, $H_2$ is pulsed along with a precursor to reduce carbon contamination in the fabricated film. In an embodiment, a tantalum-containing precursor is pulsed onto a substrate in an ALD reaction chamber. In various embodiments, after pulsing the tantalum-containing precursor and purging the reaction chamber of excess precursor and by-products from pulsing the precursor, a reactant precursor is pulsed into the reaction chamber. The reactant precursor may be an oxygen reactant precursor that may include, but is not limited to, one or more of water, atomic oxygen, molecular oxygen, ozone, hydrogen peroxide, a water—hydrogen peroxide mixture, alcohol, or nitrous oxide. In addition, the pulsing of the tantalum precursor may use a pulsing period that provides uniform coverage of a monolayer on the surface or may use a pulsing period that provides partial coverage of a monolayer on the surface during a tantalum sequence.

A number of precursors containing hafnium may be used to provide the hafnium to a substrate for an integrated circuit. In an embodiment, a precursor containing hafnium may include anhydrous hafnium nitride, $Hf(NO_3)_4$. In an embodiment using a $Hf(NO_3)_4$ precursor on a hydrogen-terminated silicon, the substrate temperature is maintained at a temperature ranging from about 160° C. to about 180° C. In an embodiment, a hafnium precursor includes $HfCl_4$. In an embodiment using a $HfCl_4$ precursor, the substrate temperature is maintained at a temperature ranging from about 180° C. to about 600° C. In an embodiment using a $HfCl_4$ precursor, the substrate temperature is maintained at a temperature ranging from about 300° C. to about 940° C. In an embodiment, a hafnium precursor is $HfI_4$. In an embodiment using a $HfI_4$ precursor, the substrate temperature is maintained at a temperature of about 300° C. Hafnium oxide may be grown by ALD using a $Hf[N(CH_3)(C_2H_5)]_4$, which may be known as a homoleptic tetrakis(dialkylamino) hafnium(IV) compound, and water as an oxygen reactant. Other types of tetrakis(dialkylamino) hafnium compounds may also be used, such as hafnium tetrakis dimethylamine, $Hf[N(CH_3)_2]_4$, or hafnium tetrakis diethylamine, $Hf[N(C_2H_5)_2]_4$, as a hafnium-containing precursor. In various embodiments, use of the individual hafnium-containing precursors is not limited to the temperature ranges of the above example embodiments. In addition, the pulsing of the hafnium precursor may use a pulsing period that provides uniform coverage of a monolayer on the surface or may use a pulsing period that provides partial coverage of a monolayer on the surface during a hafnium sequence.

In various embodiments, nitrogen is used as a purging gas and a carrier gas for one or more of the sequences used in the ALD formation of hafnium tantalum oxynitride. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In an embodiment, after repeating a selected number of ALD cycles, a determination is made as to whether the number of cycles equals a predetermined number to form the desired hafnium tantalum oxynitride layer. If the total number of cycles to form the desired thickness has not been completed, a number of cycles is repeated. In an embodiment, the thickness of a hafnium tantalum oxynitride layer formed by atomic layer deposition is determined by a fixed growth rate for the pulsing periods and precursors used, set at a value such as N nm/cycle, and the number of cycles conducted. In an embodiment, depending on the precursors used for ALD formation of a HfTaON film, the process is conducted in an ALD window, which is a range of temperatures in which the growth rate is substantially constant. In an embodiment, if such an ALD window is not available, the ALD process is conducted at the same set of temperatures for each ALD sequence in the process. For a desired hafnium tantalum oxynitride layer thickness, t, in an application, the ALD process is repeated for t/N total cycles. Once the t/N cycles have completed, further ALD processing for the hafnium tantalum oxynitride layer may be terminated. In an embodiment, a hafnium tantalum oxynitride layer processed at relatively low temperatures associated with atomic layer deposition provides an amorphous layer.

In an embodiment, a HfTaON film is grown to a desired thickness by repetition of a process including atomic layer deposition of layers of $Ta_2O_5$ and HfN and/or layers of $HfO_2$ and TaN followed by annealing. In an embodiment, a base thickness is formed according to various embodiments such that forming a predetermined thickness of a HfTaON film may be conducted by forming a number of layers having the base thickness. As can be understood by one skilled in the art, determining the base thickness depends on the application and can be determined during initial processing without undue experimentation. Relative amounts of hafnium, tantalum, oxygen, and nitrogen in a HfTaON film may be controlled by regulating the relative thicknesses of the individual layers of oxides and nitrides formed. In addition, relative amounts of hafnium, tantalum, oxygen, and nitrogen in a HfTaON film may be controlled by forming a layer of HfTaON as multiple layers of different base thickness and by regulating the relative thicknesses of the individual layers of oxides and nitrides formed in each base layer prior to annealing. As can be understood by those skilled in the art, particular effective growth rates for the selected hafnium tantalum oxynitride film can be determined during normal initial testing of the ALD system used in processing a hafnium tantalum oxynitride dielectric for a given application without undue experimentation.

Atomic Layer Deposition and Nitridization

Figure 2A:
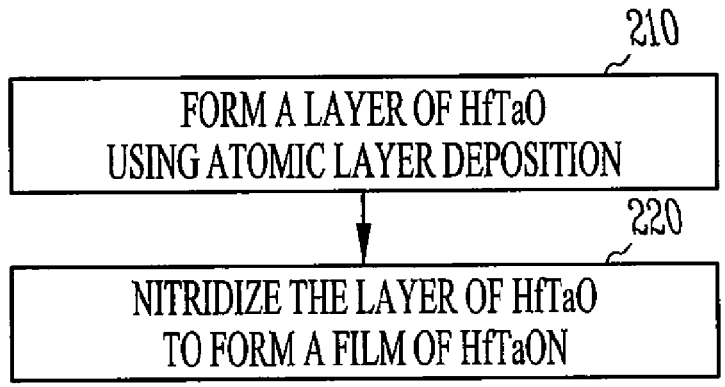
FIG. 2A shows a flow diagram of features of an embodiment for forming a hafnium tantalum oxynitride film using atomic layer deposition and nitridization.

FIG. 2A shows a flow diagram of features of an embodiment for forming HfTaON using atomic layer deposition and nitridization. At 210, a layer of HfTaO is formed using atomic layer deposition. At 220, the layer of HfTaO is subjected to nitridization to form a HfTaON film. The nitridization may be a high temperature nitridization. In the nitridization process, active nitrogen may be introduced by microwave plasma. In the nitridization process, active nitrogen may be introduced by a $NH_3$ anneal. A high temperature nitridization is a nitridizing process that is performed at temperatures equal to or above 500° C. In various embodiments, HfTaO is formed by atomic layer deposition using ALD cycles of tantalum/oxygen sequences and hafnium/oxygen sequences. Depending on the amounts of tantalum, hafnium, and oxygen to be provided in the HfTaO film, the ALD cycle can be selected from a number of different permutations of tantalum/oxygen sequences and hafnium/oxygen sequences.

Figure 2B:
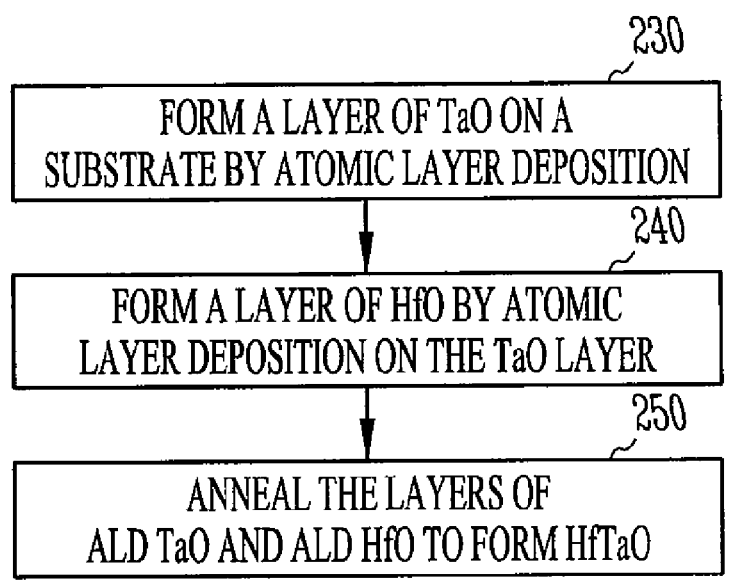
FIG. 2B shows a flow diagram of features of an embodiment for forming hafnium tantalum oxide using atomic layer deposition for nitridization to a hafnium tantalum oxynitride film.

FIG. 2B shows a flow diagram of features of an embodiment for forming HfTaO using atomic layer deposition for nitridization to a HfTaON film. At 230, a layer of tantalum oxide is formed on a substrate by atomic layer deposition. At 240, a layer of hafnium oxide is formed by atomic layer deposition on the layer of tantalum oxide. At 250, the layers of tantalum oxide and hafnium oxide are annealed to form a layer of HfTaO. The order of forming $Ta_2O_5$ and $HfO_2$ may be interchanged. The layer of HfTaO may be nitridized to form HfTaON. Alternatively, the layers of tantalum oxide and hafnium oxide may be nitridized during the annealing process. In an embodiment, alternating layers of ALD tantalum oxide and ALD hafnium oxide are formed to a desired thickness prior to nitridization. In an embodiment, a layer of ALD tantalum oxide and a layer of ALD hafnium oxide are formed, each to a desired thickness, the layers of ALD tantalum oxide and ALD hafnium oxide nitridized to form a HfTaON layer. Then, a layer of ALD tantalum oxide and a layer of ALD hafnium oxide may be formed on the HfTaON layer, the layers of ALD tantalum oxide and ALD hafnium oxide nitridized to form a HfTaON layer on and contiguous with the previously formed HfTaON layer. This process may be continued until the desired thickness of HfTaON is formed.

In an embodiment, ALD $Ta_2O_5$ is formed using a number of precursors containing tantalum to provide the tantalum to a substrate for an integrated circuit. Such tantalum-containing precursors include, but are not limited to, a tantalum halide precursor, such as $TaCl_5$, $Ta(N-t-C_5H_{11})[N(CH_3)_2]_3$, or tantalum ethoxide $Ta(OC_2H_5)_5$. After pulsing the tantalum-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. After pulsing the oxygen-containing precursor, the reaction chamber may be purged of excess precursor and by-products. In addition, the pulsing of the precursors may use pulsing periods that provide uniform coverage of a monolayer on the surface or may use pulsing periods that provide partial coverage of a monolayer on the surface during a tantalum/oxygen ALD cycle.

In an embodiment, ALD $HfO_2$ is formed using a number of precursors containing hafnium to provide the hafnium to a substrate for an integrated circuit. Such hafnium-containing precursors include, but are not limited to, a hafnium halide, such as $HfCl_4$ and $HfI_4$, $Hf(NO_3)_4$, $Hf[N(CH_3)(C_2H_5)]_4$, $Hf[N(CH_3)_2]_4$, and $Hf[N(C_2H_5)_2]_4$. After pulsing the hafnium-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In addition, the pulsing of the precursors may use pulsing periods that provide uniform coverage of a monolayer on the surface or may use pulsing periods that provide partial coverage of a monolayer on the surface during an ALD cycle forming $HfO_2$.

In various embodiments, nitrogen is used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Atomic Layer Deposition and Oxidation

Figure 3:
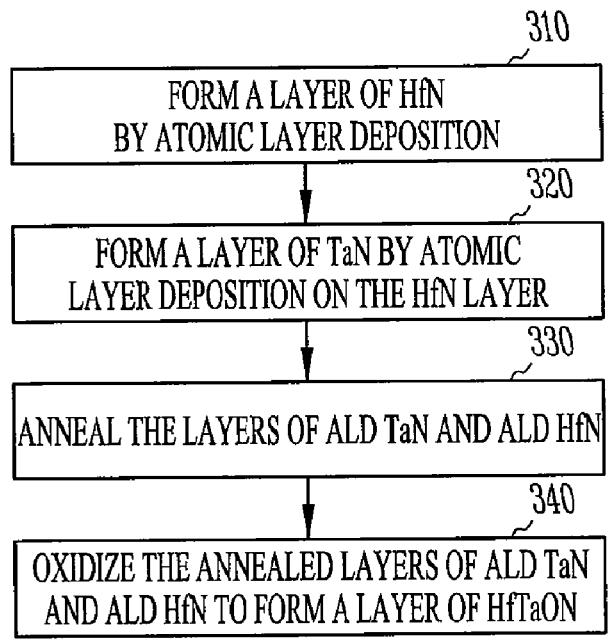
FIG. 3 shows a flow diagram of features of an embodiment for forming a hafnium tantalum oxynitride film using atomic layer deposition and oxidation.

FIG. 3 shows a flow diagram of features of an embodiment for forming HfTaON using atomic layer deposition and oxidation. At 310, a layer of HfN is formed by atomic layer deposition. At 320, a layer of TaN is formed by atomic layer deposition on the layer of HfN. HfN and TaN films may be alternately deposited in adjacent layers, in which either nitride layer may be deposited as the starting layer. At 330, the layers of TaN and HfN are annealed. At 340, the annealed layers of TaN and HfN are oxidized to form HfTaON. In an embodiment, the annealing and oxidation may be performed together. The layers of TaN and HfN may be annealed and oxidized by rapid thermal oxidation to form HfTaON.

In an embodiment, ALD HfN is formed using a number of precursors containing hafnium to provide the hafnium to a substrate for an integrated circuit. To form hafnium nitride by ALD, a hafnium-containing precursor is pulsed onto a substrate in an ALD reaction chamber. A number of precursors containing hafnium may be used to provide the hafnium to a substrate for an integrated circuit. The hafnium-containing precursor may be a hafnium halide precursor, such as $HfCl_4$ or $HfI_4$. In addition to halide precursors, the hafnium nitride may be grown by ALD using $Hf[N(CH_3)(C_2H_5)]_4$. In an embodiment, the substrate is held at a temperature ranging from about 150° C. to about 300° C. Other types of tetrakis (dialkylamino) metal compounds may also be used, such as hafnium tetrakis dimethylamine, $Hf[N(CH_3)_2]_4$, or hafnium tetrakis diethylamine, $Hf[N(C_2H_5)_2]_4$, as a hafnium-containing precursor. In various embodiments, after pulsing the hafnium-containing precursor and purging the reaction chamber of excess precursor and by-products from pulsing the precursor, a reactant precursor is pulsed into the reaction chamber. The reactant precursor may be a nitrogen reactant precursor including, but not limited to, ammonia ($NH_3$). Other nitrogen reactant precursors that may be used include nitrogen-containing compositions that do not include oxygen. In various embodiments, use of the individual hafnium-containing precursors is not limited to the temperature ranges of the above embodiments. Further, forming hafnium nitride by atomic layer deposition is not limited to the abovementioned precursors. In addition, the pulsing of the hafnium precursor may use a pulsing period that provides uniform coverage of a monolayer on the surface or may use a pulsing period that provides partial coverage of a monolayer on the surface during a hafnium sequence.

In an embodiment, ALD TaN is formed using a number of precursors containing tantalum to provide the tantalum to a substrate for an integrated circuit. To form tantalum nitride by atomic layer deposition, a tantalum-containing precursor is pulsed onto a substrate in an ALD reaction chamber. Precursors containing tantalum may be used to provide the tantalum to a substrate for an integrated circuit. The tantalum-containing precursor may be a tantalum halide precursor, such as $TaF_5$, $TaCl_5$, or $Ta(N-t-C_5H_{11})[N(CH_3)_2]_3$. Additional information regarding metal nitride layers formed by ALD can be found in U.S. patent application Ser. No. 10/352,507, referenced previously. In an embodiment, $H_2$ is pulsed along with the precursor to reduce carbon contamination in the deposited film. After pulsing the tantalum-containing precursor and purging the reaction chamber of excess precursor and by-products from pulsing the precursor, a reactant precursor may be pulsed into the reaction chamber. To form TaN, a nitrogen reactant precursor is pulsed. A number of precursors containing nitrogen may be used to provide nitrogen. Such nitrogen-containing precursors include, but are not limited to, nitrogen, ammonia ($NH_3$), tert-butylamine ($C_4H_{11}N$), allylamine ($C_3H_7N$), 1,1-dimethylhydrazine (($CH_3$)$_2NNH_2$). In an embodiment, the substrate is maintained at a temperature ranging from about 400° C. to about 500° C. using tert-butylamine or allylamine as a nitrogen precursor. In an embodiment, $NH_3$ is pulsed with the tert-butylamine and the allylamine. The addition of $NH_3$ may enhance the deposition rate at lower temperatures. In various embodiments, use of the individual tantalum-containing precursors is not limited to the temperature ranges of the above example embodiments. Further, forming tantalum nitride by atomic layer deposition is not limited to the abovementioned precursors. In addition, the pulsing of the tantalum precursor may use a pulsing period that provides uniform coverage of a monolayer on the surface or may use a pulsing period that provides partial coverage of a monolayer on the surface during a tantalum/nitrogen sequence.

In various embodiments, nitrogen is used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Atomic Layer Deposition and Annealing

Figure 4:
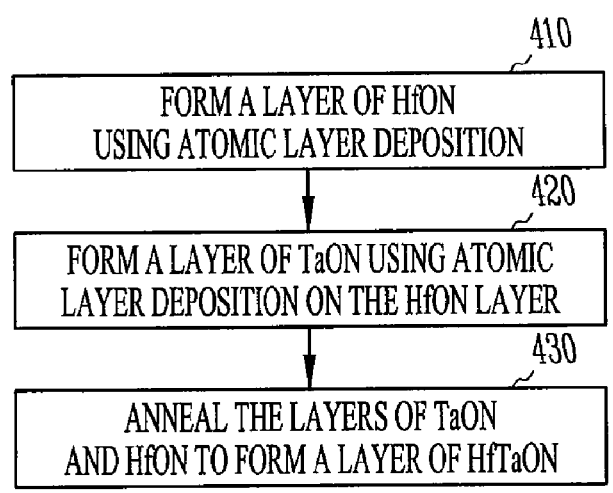
FIG. 4 shows a flow diagram of features of an embodiment for forming hafnium tantalum oxynitride film using atomic layer deposition and annealing.

FIG. 4 shows a flow diagram of features of an embodiment for forming HfTaON using atomic layer deposition and annealing. At 410, a layer of HfON is formed using atomic layer deposition. At 420, a layer of TaON is formed using atomic layer deposition on the layer of HfON. At 430, the layers of HfON and TaON react during annealing to form a layer of HfTaON. HfON and TaON films may be alternately deposited in adjacent layers, in which either oxynitride layer may be deposited as the starting layer.

In an embodiment, ALD TaON is formed using a number of precursors containing tantalum to provide the tantalum to a substrate for an integrated circuit. Such tantalum-containing precursors include, but are not limited to, a tantalum halide, such as $TaF_5$, $TaCl_5$, or $Ta(N-t-C_5H_{11})[N(CH_3)_2]_3$, and tantalum ethoxide $Ta(OC_2H_5)_5$. After pulsing the tantalum-containing precursor and purging the reaction chamber of excess precursor and by-products from pulsing the precursor, a reactant precursor may be pulsed into the reaction chamber. A nitrogen reactant precursor may be pulsed. A number of precursors containing nitrogen may be used to provide nitrogen. Such nitrogen-containing precursors include, but are not limited to, nitrogen, ammonia ($NH_3$), tert-butylamine ($C_4H_{11}N$), allylamine ($C_3H_7N$), and 1,1-dimethylhydrazine (($CH_3$)$_2NNH_2$). After pulsing the nitrogen-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In various embodiments, the order of pulsing the precursors may vary. In various embodiments, forming tantalum oxynitride by atomic layer deposition is not limited to the abovementioned precursors. In addition, the pulsing of the precursors may use pulsing periods that provide uniform coverage of a monolayer on the surface or may use pulsing periods that provide partial coverage of a monolayer on the surface during an ALD cycle forming TaON.

In an embodiment, ALD HfON is formed using a number of precursors containing hafnium to provide the hafnium to a substrate for an integrated circuit. Such hafnium-containing precursors include, but are not limited to, a hafnium halide, such as $HfCl_4$ or $HfI_4$, $Hf[N(CH_3)(C_2H_5)]_4$, hafnium tetrakis dimethylamine, $Hf[N(CH_3)_2]_4$, or hafnium tetrakis diethylamine, $Hf[N(C_2H_5)_2]_4$. In various embodiments, after pulsing the hafnium-containing precursor and purging the reaction chamber of excess precursor and by-products from pulsing the precursor, a nitrogen reactant precursor is pulsed into the reaction chamber. A number of precursors containing nitrogen may be used to provide nitrogen. In an embodiment, $NH_3$ is used as the nitrogen-containing precursor. Other nitrogen reactant precursors that may be used include nitrogen-containing compositions that do not include oxygen. In an embodiment, the nitrogen-containing precursor may also include oxygen. After pulsing the nitrogen-containing precursor and purging the reaction chamber of excess precursor and by-products from pulsing the precursor, an oxygen reactant precursor may be pulsed into the reaction chamber. The oxygen reactant precursor may include, but is not limited to, one or more of water, atomic oxygen, molecular oxygen, ozone, hydrogen peroxide, a water—hydrogen peroxide mixture, alcohol, or nitrous oxide. In various embodiments, the order of pulsing the precursors varies. Further, forming hafnium oxynitride by atomic layer deposition is not limited to the abovementioned precursors. In addition, the pulsing of the precursors may use pulsing periods that provide uniform coverage of a monolayer on the surface or may use pulsing periods that provide partial coverage of a monolayer on the surface during an ALD cycle forming HfON.

In various embodiments, nitrogen is used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques.

Excess precursor gas and reaction by-products may be removed by the purge gas and by evacuation of the reaction chamber.

Dielectric Structures

In various embodiments, either before or after forming a HfTaON film, other dielectric layers such as HfO, TaO, HfON, TaON, dielectric nitride layers, dielectric metal silicates, insulating metal oxides, or combinations thereof may be formed as part of a dielectric layer or dielectric stack. In some embodiments, these layers of dielectric material are provided in stoichiometric form, in non-stoichiometric form, or a combination of stoichiometric dielectric material and non-stoichiometric dielectric material. In some embodiments, these layers of dielectric material are provided in homogeneous form. In some embodiments, these layers of dielectric material are provided in amorphous form. In an embodiment, depending on the application, a dielectric stack containing a $Hf_xTa_yO_zN_w$ film includes a silicon oxide layer. In an embodiment, the dielectric layer is formed as a nanolaminate. An embodiment of a nanolaminate includes a layer of a hafnium oxide and a $Hf_xTa_yO_zN_w$ film, a layer of hafnium nitride and a $Hf_xTa_yO_zN_w$ film, a layer of hafnium oxynitride and a $Hf_xTa_yO_zN_w$ film, a layer of tantalum oxide and a $Hf_xTa_yO_zN_w$ film, a layer of tantalum nitride and a $Hf_xTa_yO_zN_w$ film, and a layer of tantalum oxynitride and a $Hf_xTa_yO_zN_w$ film, layers of hafnium oxide, tantalum oxide, hafnium oxynitride, and tantalum oxynitride along with a $Hf_xTa_yO_zN_w$ film, or various other combinations. In an embodiment, a dielectric layer is formed substantially as the hafnium tantalum oxynitride film.

In various embodiments, the structure of an interface between a dielectric layer and a substrate on which it is disposed is controlled to limit the inclusion of silicon oxide, since a silicon oxide layer might reduce the effective dielectric constant of the dielectric layer. In an embodiment, the material composition and properties for an interface layer are dependent on process conditions and the condition of the substrate before forming the dielectric layer. In an embodiment, though the existence of an interface layer effectively reduces the dielectric constant associated with the dielectric layer and its substrate, the interface layer, such as a silicon oxide interface layer or other composition interface layer, may improve the interface density, fixed charge density, and channel mobility of a device having this interface layer.

In an embodiment, a hafnium tantalum oxynitride layer is doped with other elements. The doping may be employed to enhance the leakage current characteristics of the dielectric layer containing the $Hf_xTa_yO_zN_w$ film by providing a disruption or perturbation of the hafnium tantalum oxynitride structure. In an embodiment, such doping is realized by substituting a sequence of one of these elements for a hafnium sequence, a tantalum sequence, or various combinations of sequences. The choice for substitution may depend on the form of the hafnium tantalum oxynitride structure with respect to the relative amounts of hafnium atoms and tantalum atoms desired in the oxide. In an embodiment, to maintain a substantially hafnium tantalum oxynitride, the amount of dopants inserted into the oxynitride are limited to a relatively small fraction of the total number of hafnium and tantalum atoms.

After forming a dielectric having a hafnium tantalum oxynitride layer, other material may be formed upon the hafnium tantalum oxynitride layer. In an embodiment, the other material is a conductive material. The conductive material may be used as an electrode. Such electrodes may be used as capacitor electrodes, control gates in transistors, or floating gates in floating gate transistors, among others. In an embodiment, the conductive material is a metal or conductive metal nitride. In an embodiment, the conductive material is a conductive semiconductor material. In an embodiment, the conductive material is formed by ALD processes. In an embodiment, the conductive material is formed by a substitution process. In an embodiment, the conductive material is formed in a self-alignment process.

Atomic Layer Deposition of Conductive Layers

In various embodiments, a conductive layer is deposited by atomic layer deposition on a layer of HfTaON or on a dielectric layer containing a layer of HfTaON. A metal layer may be deposited by atomic layer deposition in an ALD cycle having a halide precursor containing the metal to be deposited and a reactant precursor containing hydrogen. Metal layer formation by ALD is not limited to halide precursors and hydrogen reactant precursors. In various embodiments, precursors are selected to form ALD conductive layers such as aluminum (Al), tungsten (W), molybdenum (Mo), gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), germanium (Ge), or metallic nitrides such as WN, TiN or TaN. Formation of ALD conductive layers is not limited to the abovementioned materials.

In an example embodiment, a tantalum layer is formed on a HfTaON film by atomic layer deposition using a tantalum-containing precursor. In an embodiment, a tantalum halide precursor such as $TaF_5$ or $TaCl_5$ is used with hydrogen as a reactant precursor. In an embodiment, a $TaCl_5$ precursor is used with an atomic hydrogen reactant precursor. The atomic hydrogen reactant precursor may be provided using a plasma. In an embodiment, the substrate temperature is held at a temperature ranging from about 250° C. to about 400° C. The hydrogen reactant precursor reacts at the substrate to remove the halogen, which forms the selected tantalum halide precursor, leaving tantalum on the substrate surface. After pulsing a tantalum-containing precursor and after pulsing its reactant precursor, the reaction chamber may be purged of excess precursor and/or by-products. In various embodiments, use of the individual tantalum-containing precursors is not limited to the temperature ranges of the above example embodiments. Further, forming tantalum by atomic layer deposition is not limited to the above-mentioned precursors. In addition, the pulsing of the tantalum precursor may use a pulsing period that provides uniform coverage of a monolayer on the surface or may use a pulsing period that provides partial coverage of a monolayer on the surface. The tantalum layer may be structured as one or more monolayers. The tantalum layer may have a thickness ranging from a monolayer to thousands of angstroms or more.

In an embodiment, a metal nitride layer is deposited by atomic layer deposition using a precursor containing the metal to be deposited and a reactant precursor containing nitrogen in an ALD cycle. In an example embodiment, a tantalum nitride layer is formed with a HfTaON film by atomic layer deposition using a tantalum-containing precursor. A nitrogen-containing precursor may be used as the reactant precursor for the tantalum-containing precursor. The tantalum-containing precursor and the nitrogen-containing precursor may be selected such that their use does not form a tantalum oxide in the layer of tantalum nitride being formed. The tantalum-containing precursor and the nitrogen-containing precursor may be selected such that these precursors do not include oxygen as an elemental component. In an embodiment, a tantalum halide precursor is used with $NH_3$ as a reactant precursor. In an embodiment, a $TaCl_4$ precursor is used with a $NH_3$ reactant precursor. In an embodiment, the substrate temperature is held at a temperature ranging from about 380° C. to about 500° C. In an embodiment, the substrate temperature is held at a temperature less than 600° C. After pulsing a tantalum-containing precursor and after pulsing its reactant precursor, the reaction chamber may be purged of excess precursor and/or by-products. In various embodiments, use of the individual tantalum-containing precursors is not limited to the temperature ranges of the above example embodiments. In various embodiments, forming tantalum nitride by atomic layer deposition is not limited to the abovementioned precursors, but may include other precursors containing tantalum and nitrogen. In addition, the pulsing of the tantalum precursor may use a pulsing period that provides uniform coverage of a monolayer on the surface or may use a pulsing period that provides partial coverage of a monolayer on the surface. The tantalum nitride layer may be structured as one or more monolayers. The tantalum nitride layer may have a thickness ranging from a monolayer to thousands of angstroms or more.

Metal Substitution

Figure 5A:
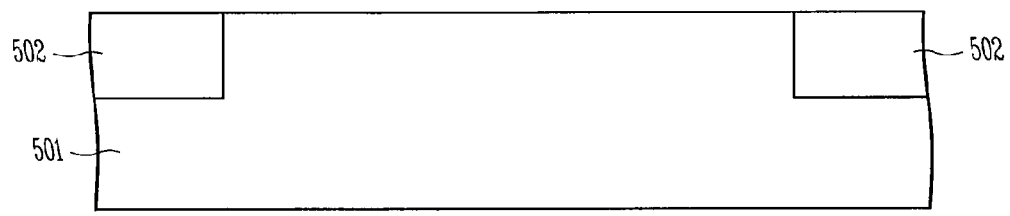
FIGS. 5A-5E illustrate an embodiment of a process for forming a metal substituted electrode.

FIGS. 5A-5E illustrate an embodiment of a process for forming a metal substituted electrode in place of a previously deposited material on a dielectric containing HfTaON. Though a transistor is discussed with reference to FIGS. 5A-5E, such a process may be used with respect to other embodiments of device configurations. FIG. 5A shows a substrate 501 and shallow trench isolation (STI) regions 502. The substrate 501 can be a semiconductor wafer as well as structures having one or more insulative, semi-insulative, conductive, or semiconductive layers and materials. Thus, for example, the substrate can include silicon-on-insulator, silicon-on-sapphire, and other structures upon which semiconductor devices are formed.

Figure 5B:
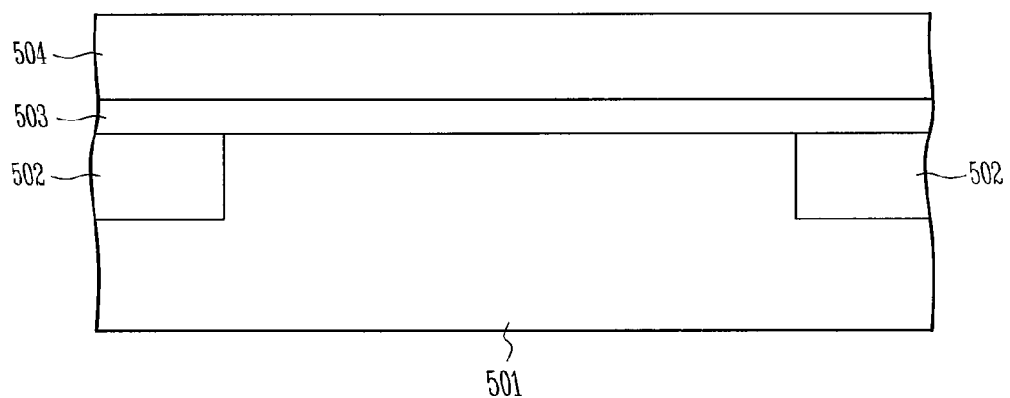

FIG. 5B further shows a gate dielectric layer 503 formed on the substrate 501, and a gate substitutable layer 504 formed on the gate dielectric layer 503. The gate dielectric layer may include a dielectric layer containing HfTaON in addition to other insulative material or a dielectric layer essentially of HfTaON. The use of such a high-κ dielectric increases the capacitance, which may be useful for nanoscale integrated circuits. In various embodiments the gate dielectric includes stacked layers comprising one or more high-κ dielectric materials. As described in more detail below, the material of the gate substitutable layer 504 may be selected with respect to the desired gate material to allow the gate material to replace the gate substitutable layer. This process forms a gate of the desired gate metal where the substitutable material was positioned on the gate dielectric.

Figure 5C:
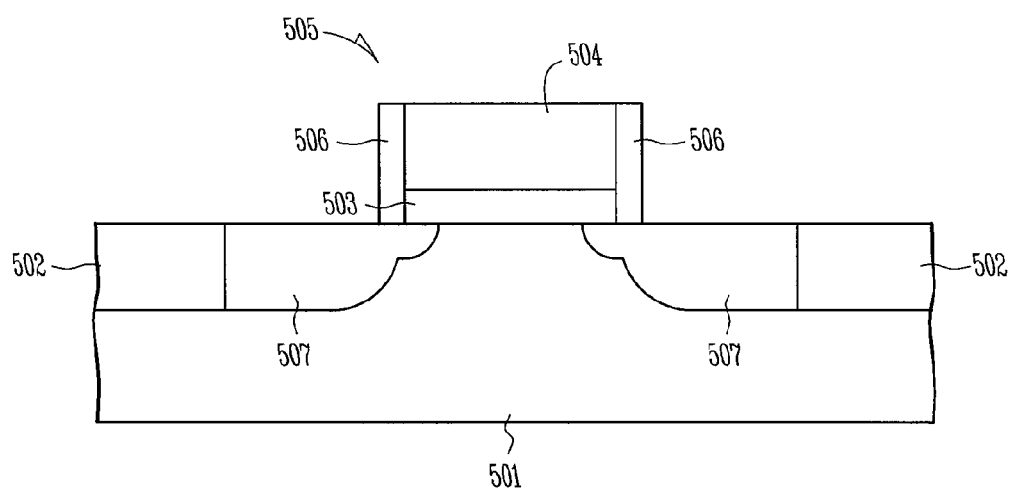

As shown in FIG. 5C, portions of the gate dielectric layer 503 and the gate substitutable layer 504 may be removed to define a gate 505. Sidewalls or spacers 506 are formed along the gate 505. Source/drain regions 507 are also formed. Source/drain regions 507 can be formed using conventional ion implantation and subsequent annealing. These annealing temperatures can pose problems for aluminum gates and other metal gates that have melting temperatures less than the anneal temperature for the source/drain regions.

Figure 5D:
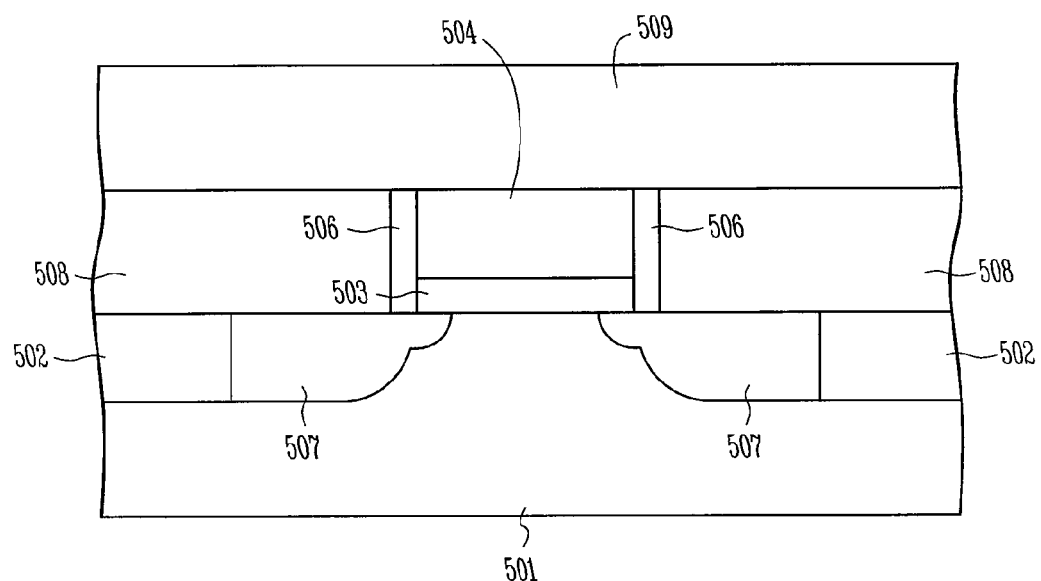

FIG. 5D shows an insulative fill layer 508 provided to match the thickness of the gate stack. A planarization procedure, such as chemical-mechanical polishing, can be used to provide an even surface across the fill layer 508 and the gate substitutable layer 504. A metal layer 509, perhaps forming a gate material, may be deposited over the gate substitutable layer 504 and the fill layer 508. The metal layer 509 is also referred to herein as a layer of gate material. Various deposition processes, such as evaporation, sputtering, chemical vapor deposition, or atomic layer deposition, may be used to form the metal layer 509. The volume of layer 509 may be significantly larger than the volume of the substitutable material left on the wafer.

After the metal layer 509 is deposited on the gate substitutable layer, a metal-substitution reaction may be induced. The reaction can be provided by annealing the structure in a non-oxidizing atmosphere such as a nitrogen gas or a forming gas. The heating urges diffusion or dissolution of the intended gate material in metal layer 509 for the substitutable material 504. The substitution process is bounded by the spacers 506 and the gate dielectric 503.

Figure 5E:
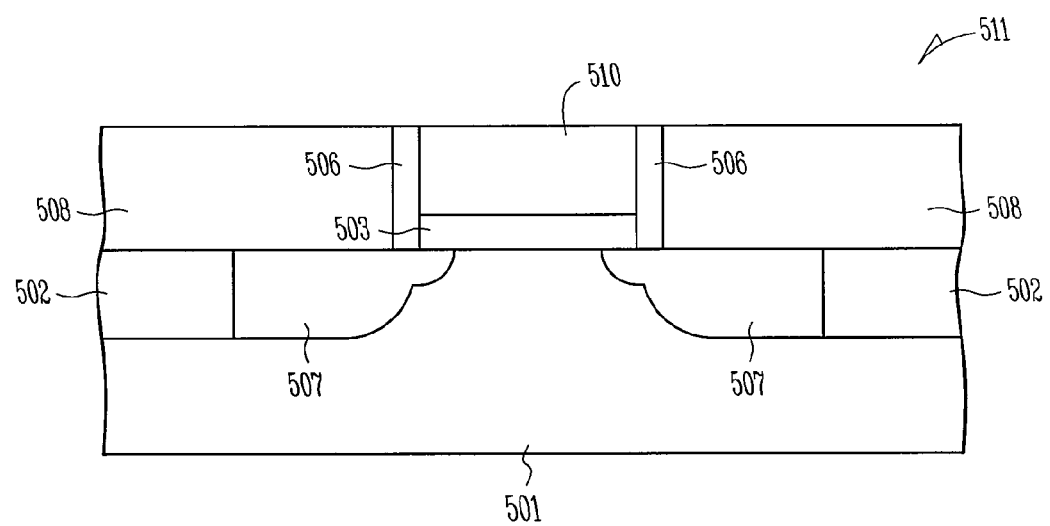

At the conclusion of the substitution reaction, the residual metal of layer 509 and the substitutable material may be removed, perhaps by using conventional planarization. FIG. 5E shows the resulting low-resistance gate structure. The illustrated structure includes a metal substituted gate 510 formed by the substitution of the metal of layer 509. The metal substituted gate 510 may include a small amount of the gate substitutable material that did not diffuse above the planarization level 511. Such small amounts of the gate substitutable material may not significantly affect the conductivity of the metal substituted gate 510, and thus do not significantly affect the performance of the device.

Drain and source contacts (not shown) can be formed, as well as interconnects to other transistors or components, using conventional techniques. Another heat treatment may occur after packaging the structure (e.g., an integrated circuit) in a protective housing in an attempt to minimize the resistivity of the metal gate contacts and other metal interconnections.

The metal gate substitution technique, as disclosed herein, can be applied to MOS devices, as generally illustrated in FIG. 5E, as well as to form metal floating gates and/or metal control gates in nonvolatile devices. Additionally, various high-κ dielectrics having a HfTaON film can be used between the floating gate and the substrate, and between the control gate and the floating gate in these nonvolatile devices.

Figure 6:
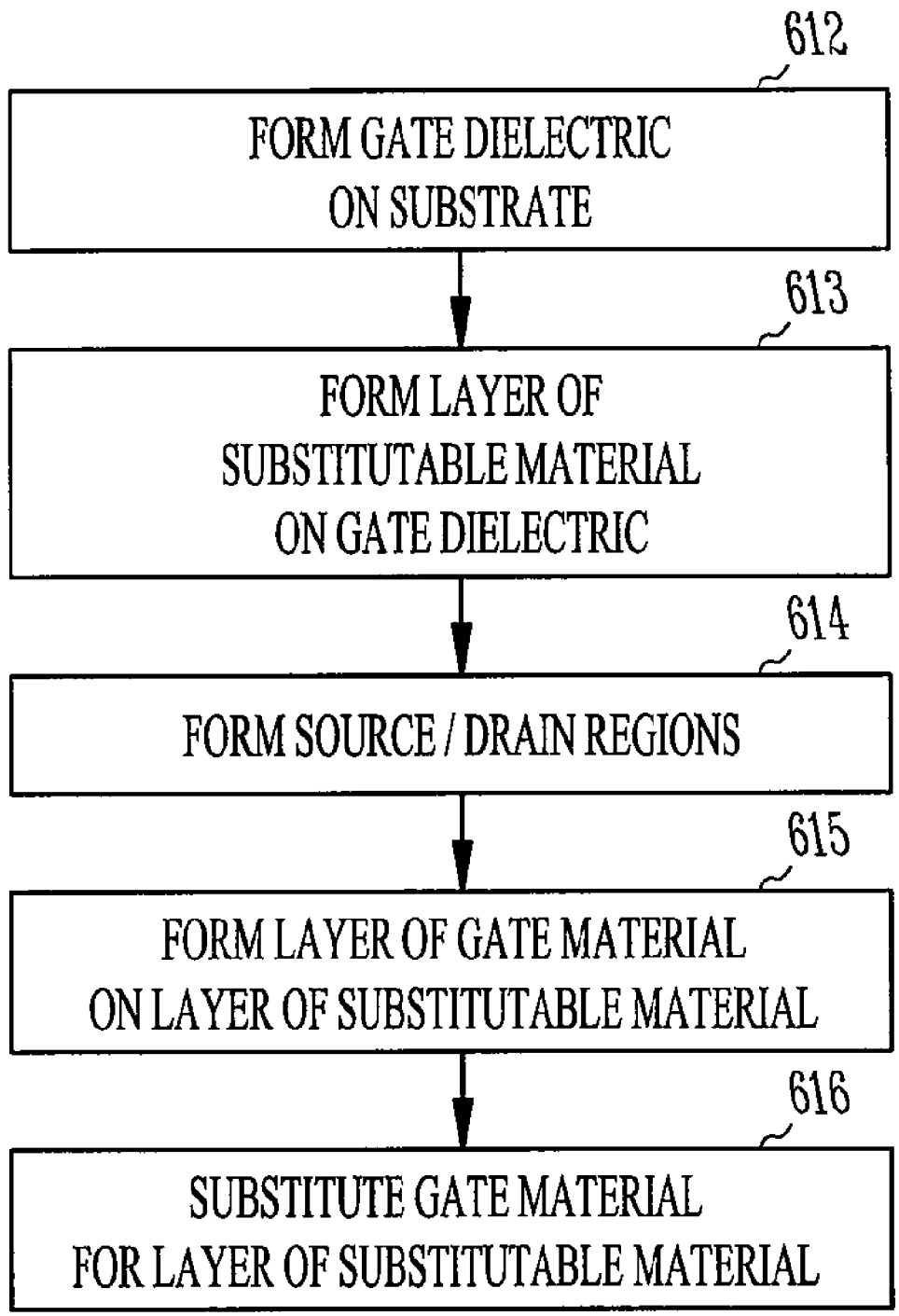
FIG. 6 illustrates a flow diagram of features of an embodiment of a metal substitution technique.

FIG. 6 illustrates a flow diagram of features of an embodiment of a metal substitution technique. At 612, a gate dielectric is formed on a substrate. The gate dielectric may include a HfTaON film. At 613, a layer of gate substitutable material is formed on the gate dielectric. Examples of gate substitutable material include polysilicon, germanium, silicon-germanium, and carbon. At 614, source/drain regions are formed. A layer of gate material is formed at 615 on the gate substitutable material. Examples of such metals include gold, silver, and aluminum. Other metals may be used. At 616, the gate material is substituted for the layer of gate substitutable material.

A metal substitution reaction substitutes or replaces the substitutable material (e.g. silicon, germanium, silicon-germanium, carbon) with a metal. After the substitution, the resulting gate structure includes substantially all of the desired metal. Small amounts of the substitutable material may remain in the gate structure. The substitution reaction can be induced by heating the integrated circuit assembly to a desired temperature in a vacuum, nitrogen, argon, forming gas or other non-oxidizing atmosphere. Heating causes diffusion of the metal layer 509 into the substitutable layer. The annealing temperature for the substitution should be less than the eutectic (lowest melting) temperature of materials involved in the substitution for the reaction for substitution to occur. In an embodiment, to form a gold gate, a metal layer is formed from gold and annealed at approximately 300° C. to substitute the gold for a silicon substitutable structure. In an embodiment, to form a silver gate, a metal layer is formed from silver and annealed at approximately 500-600° C. to substitute the silver for a silicon substitutable structure. A polysilicon and germanium substitutable material may be used, which reduces the anneal temperature.

According to various embodiments, the gate substitutable material 504 shown in FIGS. 5A-5E includes polysilicon. In some embodiments, the gate substitutable material includes germanium. Some embodiments use silicon-germanium with a percentage of silicon in the range from 0% to 100% as the gate substitutable material 504. Some embodiments use carbon as the gate substitutable material 504. With respect to various embodiments which use polysilicon, germanium, or silicon-germanium as the gate substitutable material 504, a replacement metal for the substituted gate may include aluminum, alloys of aluminum, silver, gold, an alloy of silver, an alloy of gold as the replacement metal, or combinations thereof. In various embodiments, with carbon used as the gate substitutable material 504, a replacement metal for the substituted gate include aluminium, gold, silver, alloys of aluminum, an alloy of gold, an alloy of silver, copper, platinum, rhenium, ruthenium, alloys of tantalum, alloys of tungsten, rhodium, nickel, osmium, palladium, iridium, cobalt, germanium, or combinations thereof.

Various embodiments form an integrated circuit structure using two or more substitution reactions. Relatively higher temperature substitution processes can be performed before relatively lower temperature substitution processes. One application for multiple substitution reactions is to independently adjust work functions of NMOS and PMOS transistors in CMOS integrated circuits. Multiple substitution reactions are not limited to this CMOS integrated circuit application. Additional information regarding metal substitution can be found in U.S. patent application Ser. No. 11/176,738, referenced previously.

Self Aligned Metal Technique

Figure 7A:
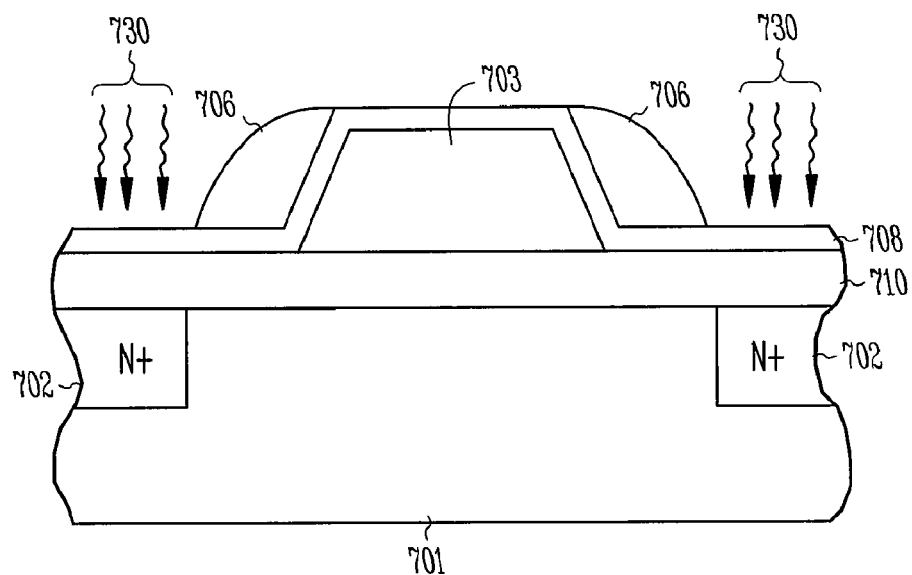
FIGS. 7A-7D illustrate an embodiment of a process for forming a self-aligned conductive layer.

FIGS. 7A-7D illustrate an embodiment of a process for forming a self aligned conductive layer such as a metal gate for a transistor structure. FIG. 7A illustrates a high-κ gate dielectric 710 containing HfTaON formed on a substrate 701. The substrate 701 may comprise a semiconductor wafer as well as structures having one or more insulative, semi-insulative, conductive, or semiconductive layers and materials. Thus, for example, the substrate can include silicon-on-insulator, silicon-on-sapphire, and other structures upon which semiconductor devices are formed.

In FIG. 7A, a sacrificial gate 703 may be formed of amorphous carbon on the high-κ gate dielectric 710. In various embodiments, an etch barrier 708 is formed over the sacrificial gate and the dielectric. The etch barrier 708 includes silicon nitride or aluminium oxide, and can be formed using a deposition process, according to various embodiments. Sacrificial sidewall spacers 706 are added adjacent the sacrificial gate 703. In various embodiments, the spacers 706 are formed of amorphous carbon by deposition and conventional direct etch techniques. An ion implantation 730 and high temperature anneal are used to form source/drain regions 702 in areas defined by the sacrificial sidewall spacers 706. These annealing temperatures can pose problems for aluminum gates and other metal gates that have melting temperatures less than the anneal temperature for the source/drain regions.

Figure 7B:
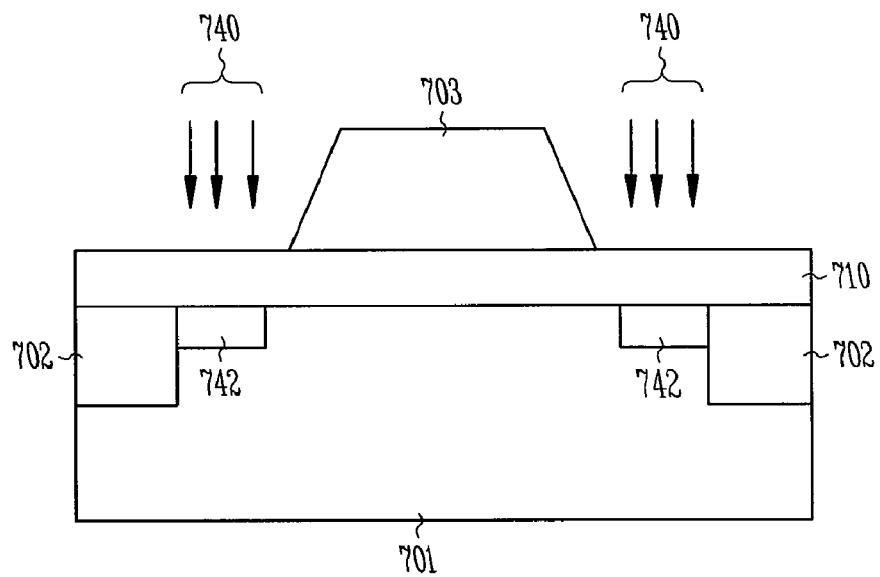

In FIG. 7B, the sacrificial sidewall spacers (706 in FIG. 7A) have been removed. Various embodiments use a plasma oxidation process to remove the sacrificial sidewall spacers. In addition, the etch barrier (708 in FIG. 7A) has been removed. In various embodiments, a light dose ion implantation 740 is used to form source/drain extensions 742 in the substrate 701. The extensions 742 can be annealed at lower temperatures and in shorter times than the more heavily doped source/drain regions 702. According to various embodiments, source/drain extensions for the transistor may be formed with doping the substrate to a depth of 30 nm or less.

Figure 7C:
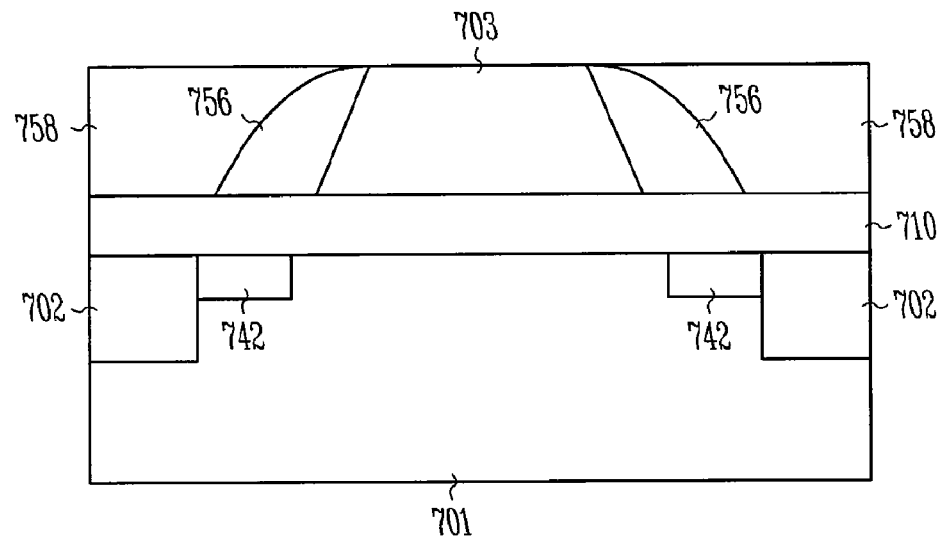

In FIG. 7C, conventional or non-carbon sidewall spacers 756 are formed and the whole structure is back filled with an oxide fill 758, such as silicon dioxide, and planarized. A planarization procedure, such as chemical-mechanical polishing, can be used to provide an even surface. In various embodiments, the conventional sidewall spacers are formed with silicon nitride.

Figure 7D:
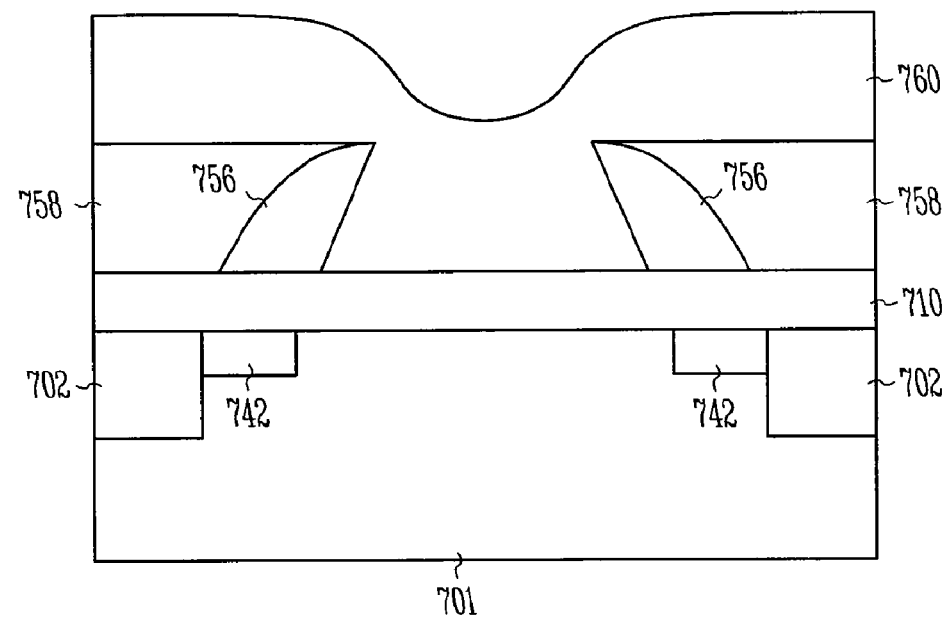

In FIG. 7D, the sacrificial gate (703 in FIG. 7C) is removed and replaced by the deposition of a metal layer 760. In various embodiments, the sacrificial gate is removed using a plasma oxidation process. Various deposition processes, such as evaporation, sputtering, chemical vapor deposition, or atomic layer deposition, may be used to form the metal layer 760. The structure is planarized (not shown) using a planarization procedure, such as chemical-mechanical polishing, resulting in the self aligned metal gate over the high-κ gate dielectric insulator 710. Drain and source contacts (not shown) can be formed, as well as interconnects to other transistors or components, using conventional techniques. Another heat treatment may occur after packaging the structure (e.g., an integrated circuit) in a protective housing in an attempt to minimize the resistivity of the metal gate contacts and other metal interconnections.

FIGS. 7A-7D illustrate two replacement processes for the formation of planar self aligned metal gate transistors, one for disposable sidewall spacers and the other for the gate material itself. The metal gate replacement technique, as disclosed herein, can be applied to MOS devices, as generally illustrated in FIGS. 7A-7D, as well as to form metal floating gates and/or metal control gates in nonvolatile devices. Additionally, various high-κ dielectrics can be used between the floating gate and the substrate, and between the control gate and the floating gate in these nonvolatile devices.

Figure 8:
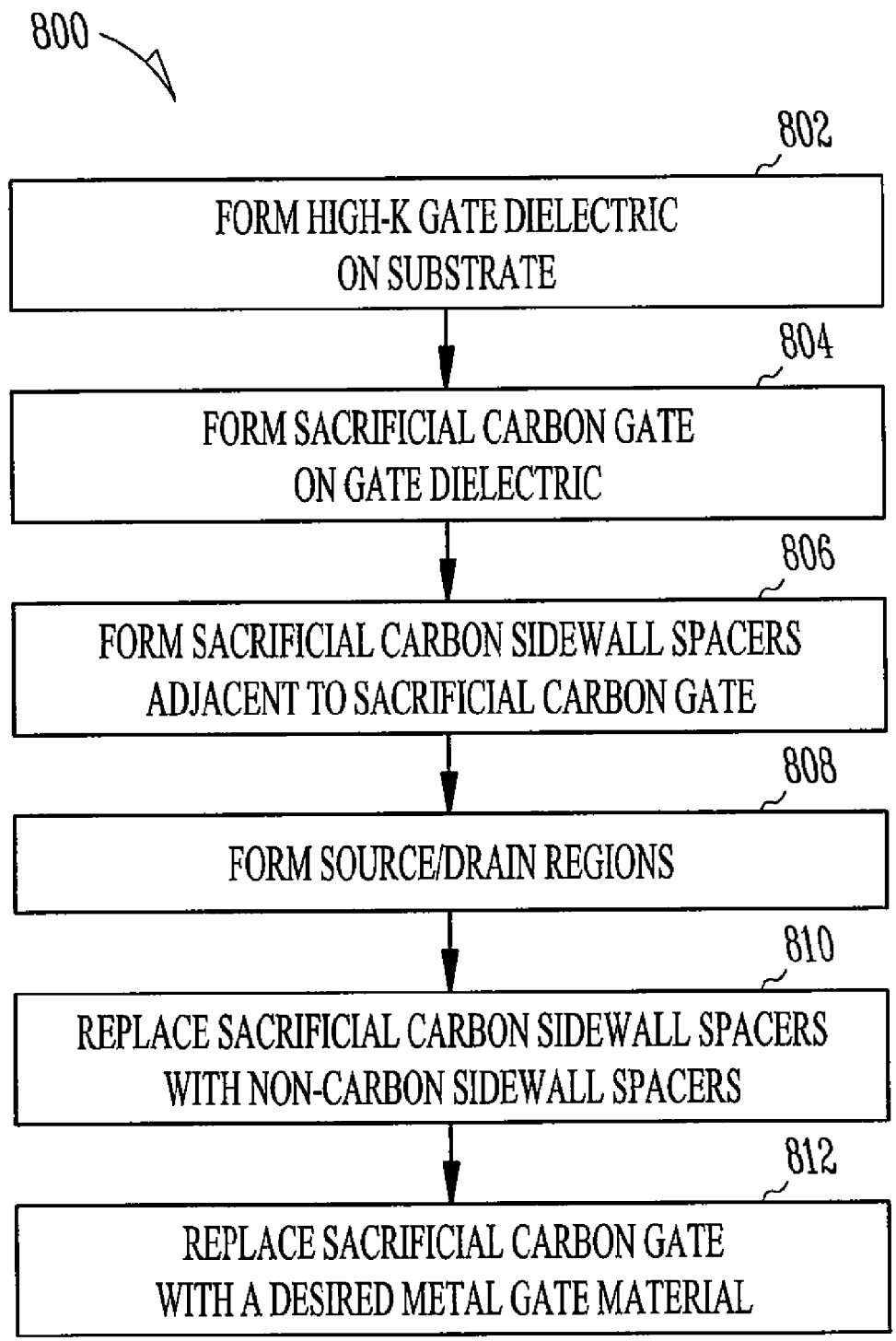
FIG. 8 illustrates an embodiment of a method for forming a self aligned metal gate on high-κ gate dielectrics containing a hafnium tantalum oxynitride film.

FIG. 8 illustrates an embodiment of a method 800 for forming a self aligned metal gate on high-κ gate dielectrics containing HfTaON. According to various embodiments, a high-κ gate dielectric containing HfTaON is formed on a substrate, at 802. At 804, a sacrificial carbon gate is formed on the gate dielectric. At 806, sacrificial carbon sidewall spacers are formed adjacent to the sacrificial carbon gate. At 808 source/drain regions for the transistor are formed, using the sacrificial carbon sidewall spacers to define the source/drain regions. The sacrificial carbon sidewall spacers are replaced with non-carbon sidewall spacers at 810. At 812, the sacrificial carbon gate is replaced with a desired metal gate material to provide the desired metal gate material on the gate dielectric.

In various embodiments, source/drain extensions may be formed after removing the carbon sidewall spacers and before replacing with non-carbon sidewall spacers. An etch barrier can be used in various embodiments to separate the sacrificial carbon gate from the sacrificial carbon sidewall spacers. In various embodiments, the carbon sacrificial gate is replaced with aluminum (Al), alloys of aluminum, tungsten (W), molybdenum (Mo), gold (Au), silver (Ag), gold alloy, silver alloy, copper (Cu), platinum (Pt), rhenium (Re), ruthenium (Ru), rhodium (Rh), nickel (Ni), osmium (Os), palladium (Pd), iridium (Ir), cobalt (Co), germanium (Ge), or metallic nitrides such as WN, TiN or TaN covered by metals. The high-κ gate dielectric formed at 802 may be one of a number of high-κ gate dielectrics containing HfTaON.

In various embodiments, construction of an integrated circuit structure includes a dielectric containing HfTaON on which is disposed a self-aligned metal electrode. Additional information regarding a self-aligned metal electrode used as a transistor gate can be found in U.S. patent application Ser. No. 11/216,375, referenced previously.

Device Structures

Figure 9A:
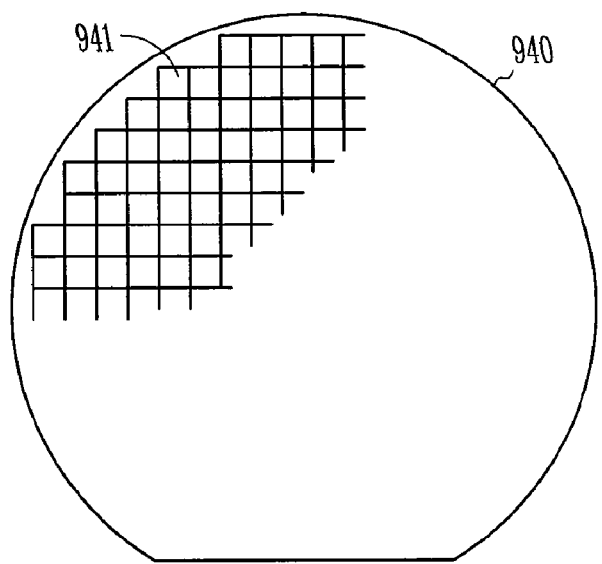
FIG. 9A-B illustrate a wafer containing integrated circuits having a hafnium tantalum oxynitride film.
Figure 9B:
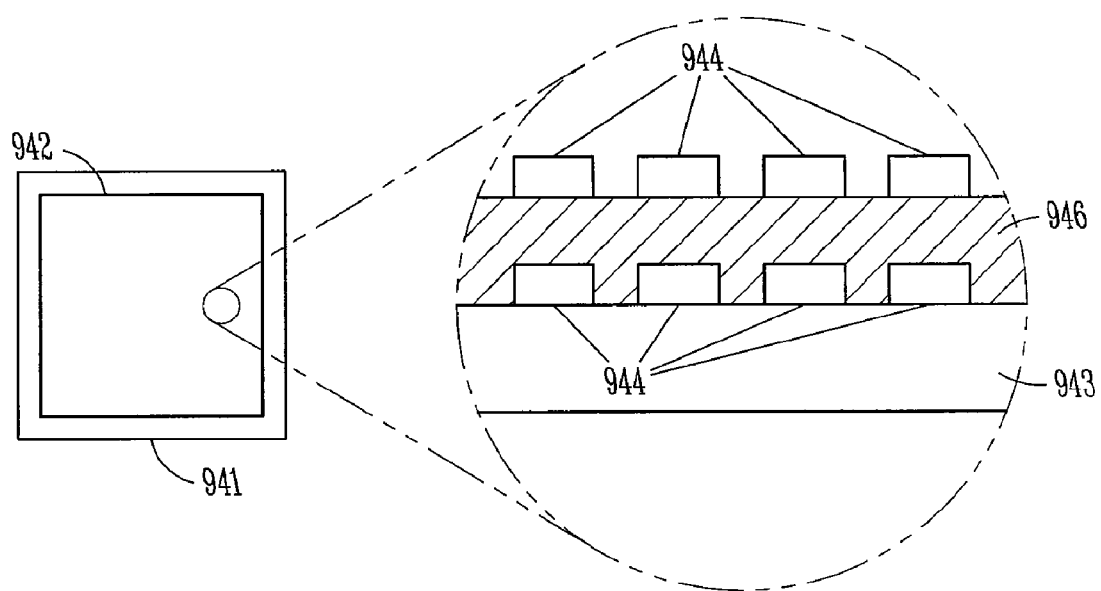

FIG. 9A-B illustrate an embodiment of a wafer 940 containing integrated circuits having one or more dielectric layers that include a hafnium tantalum oxynitride film. A number of dice can be formed on a wafer. FIG. 9A illustrates die 941 as an individual pattern on a substrate that contains integrated circuitry 942 to perform a specific function. A semiconductor wafer typically contains a repeated pattern of such dice with the same functionality, but may include dice with circuitry having different functionalities.

FIG. 9B illustrates, generally, a portion of a cross-section of integrated circuit 942 of die 941. In this example, conductive electrodes 944 are disposed on substrate 943 and further disposed on dielectric layer 946 that includes hafnium tantalum oxynitride in a number of configurations such as capacitors, transistors and elements of a memory. The conductive electrodes may be metal electrodes, conductive metal nitride electrodes, polysilicon, and/or conductive metal oxide electrodes. The conductive electrodes may be atomic layer deposited electrodes. Metal electrodes may be metal substituted electrodes and/or self aligned metal electrodes formed in accordance with the teachings of embodiments discussed herein. A die is typically packaged in a protective casing (not shown) with leads extending therefrom (not shown) providing access to the circuitry of the die for communication and control. A common wafer size is 8 inches in diameter. However, wafers are capable of being fabricated in other sizes, and embodiments of wafers containing a hafnium tantalum oxynitride film are not limited to a particular size.

Applications containing electronic devices having dielectric layers containing hafnium tantalum oxynitride film include electronic systems for use in memory modules, device drivers, power modules, communication modems, processor modules, and application-specific modules, which may include multilayer, multichip modules. Such dielectric layers may be configured as multiple layers containing at least one layer of HfTaON or configured substantially as a HfTaON layer. In addition, such dielectric layers may be configured in contact with a metal electrode. For a given applied voltage, the magnitude (or strength) of an electric field across the HfTaON layer is based on its dielectric constant and its thickness. In general, the strength of such an electric field decreases as the value of the dielectric constant increases, and also as dielectric thickness increases. In some embodiments, the thickness of the hafnium tantalum oxynitride layer may be adjusted to obtain a specified electric field between one or more electrodes. In various embodiments, the dielectric constant of the hafnium tantalum oxynitride layer may be adjusted to obtain a specified electric field between one or more electrodes. In some embodiments, the dielectric constant and thickness of the hafnium tantalum oxynitride layer in combination may be adjusted to obtain a specified electric field between one or more electrodes. The electric field strength across a HfTaON layer may be adjusted as desired to achieve a particular circuit function or circuit characteristic. Such circuitry can be a subcomponent of a variety of electronic systems, such as a clock, a television, a cell phone, a personal computer, an automobile, an industrial control system, an aircraft, and others.

Figure 10:
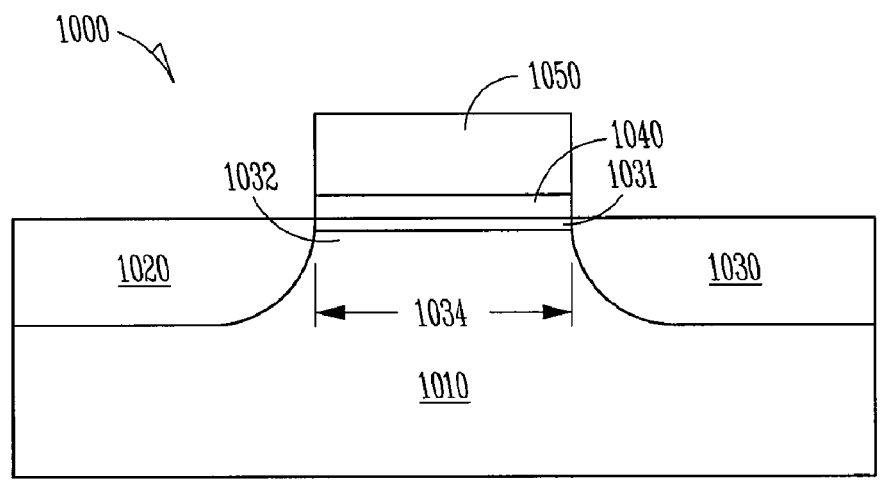
FIG. 10 shows an embodiment of a transistor having a dielectric layer including a hafnium tantalum oxynitride film.

FIG. 10 shows an embodiment of a transistor 1000 having a dielectric layer 1040 containing a $Hf_xTa_yO_zN_w$ film. In an embodiment, transistor 1000 includes a source region 1020 and a drain region 1030 in a silicon-based substrate 1010 where source and drain regions 1020, 1030 are separated by a body region 1032. Body region 1032 defines a channel having a channel length 1034. In an embodiment, a gate dielectric 1040 is disposed on substrate 1010 with gate dielectric 1040 formed as a dielectric layer containing $Hf_xTa_yO_zN_w$. In an embodiment, gate dielectric 1040 is realized as a dielectric layer formed substantially of $Hf_xTa_yO_zN_w$. In an embodiment, gate dielectric 1040 is constructed as multiple dielectric layers, that is, as a dielectric stack, containing at least one $Hf_xTa_yO_zN_w$ film and one or more layers of insulating material other than hafnium tantalum oxynitride film. In an embodiment, the $Hf_xTa_yO_zN_w$ film is structured as one or more monolayers. An embodiment of a $Hf_xTa_yO_zN_w$ film is formed using atomic layer deposition. In an embodiment, gate dielectric 1040 is realized as a gate insulator in a silicon-based structure.

In an embodiment, a gate 1050 is formed on and contacts gate dielectric 1040. In an embodiment, gate 1050 includes conductive material. In an embodiment, gate 1050 includes a conductive material structured as one or more monolayers. In an embodiment, the conductive material layer is an ALD conductive material layer. In an embodiment, the conductive material layer is a substituted metal layer. In an embodiment, the conductive material layer is a self-aligned metal layer. In an embodiment, the thickness of the conductive layer ranges from a monolayer to thousands of angstroms or more.

An interfacial layer 1031 may form between body region 1032 and gate dielectric 1040. In an embodiment, an interfacial layer is limited to a relatively small thickness compared to gate dielectric 1040, or to a thickness significantly less than gate dielectric 1040 as to be effectively eliminated. In an embodiment, forming the substrate and the source and drain regions is performed using standard processes known to those skilled in the art. In an embodiment, the sequencing of the various elements of the process for forming a transistor is conducted with fabrication processes known to those skilled in the art. In an embodiment, transistor 1000 is a MOSFET transistor. In an embodiment, transistor 1000 is a germanium MOSFET structure. In an embodiment, transistor 1000 is a silicon MOSFET structure. In an embodiment, transistor 1000 is a silicon-germanium (SiGe) MOSFET structure. In an embodiment, transistor 1000 is a gallium arsenide MOSFET structure. In an embodiment, transistor 1000 is a NMOS transistor. In an embodiment, transistor 1000 is a PMOS transistor. Transistor 1000 is not limited to the arrangement illustrated in FIG. 10. For example, transistor 1000 may be structured as a vertical transistor. In various embodiments, use of a gate dielectric containing hafnium tantalum oxynitride is not limited to silicon-based substrates, but is used with a variety of semiconductor substrates.

Figure 11:
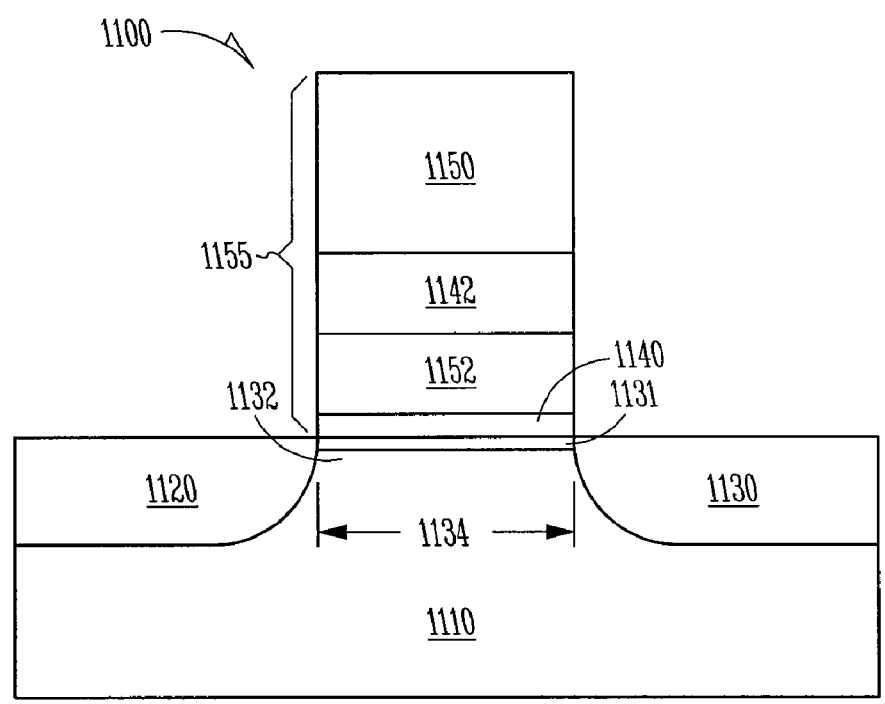
FIG. 11 shows an embodiment of a floating gate transistor having a dielectric layer including a hafnium tantalum oxynitride film.

FIG. 11 shows an embodiment of a floating gate transistor 1100 having a dielectric layer containing a $Hf_xTa_yO_zN_w$ film. In an embodiment, the $Hf_xTa_yO_zN_w$ film is structured as one or more monolayers. In an embodiment, the $Hf_xTa_yO_zN_w$ film is formed using atomic layer deposition techniques. In an embodiment, transistor 1100 includes a silicon-based substrate 1110 with a source 1120 and a drain 1130 separated by a body region 1132. Body region 1132 between source 1120 and drain 1130 defines a channel region having a channel length 1134. Located above body region 1132 is a stack 1155 including a gate dielectric 1140, a floating gate 1152, a floating gate dielectric 1142 (inter-gate dielectric 1142), and a control gate 1150. An interfacial layer 1131 may form between body region 1132 and gate dielectric 1140. In an embodiment, such an interfacial layer is limited to a relatively small thickness compared to gate dielectric 1140 or to a thickness significantly less than gate dielectric 1140 as to be effectively eliminated.

In an embodiment, gate dielectric 1140 includes a dielectric containing an atomic layer deposited $Hf_xTa_yO_zN_w$ film formed in embodiments similar to those described herein. In an embodiment, gate dielectric 1140 is realized as a dielectric layer formed substantially of $Hf_xTa_yO_zN_w$. In an embodiment, gate dielectric 1140 is a dielectric stack containing at least one $Hf_xTa_yO_zN_w$ film and one or more layers of other insulating materials.

In an embodiment, floating gate 1152 is formed on and contacts gate dielectric 1140. In an embodiment, floating gate 1152 includes conductive material. In an embodiment, floating gate 1152 is structured as one or more monolayers. In an embodiment, floating gate 1152 is an ALD layer. In an embodiment, floating gate 1152 is a substituted metal layer. In an embodiment, floating gate 1152 is a self-aligned metal layer. In an embodiment, the thickness of the floating gate layer ranges from a monolayer to thousands of angstroms or more.

In an embodiment, floating gate dielectric 1142 includes a dielectric containing a $Hf_xTa_yO_zN_w$ film. In an embodiment, the $Hf_xTa_yO_zN_w$ film is structured as one or more monolayers. In an embodiment, the $Hf_xTa_yO_zN_w$ is formed using atomic layer deposition techniques. In an embodiment, floating gate dielectric 1142 is realized as a dielectric layer formed substantially of $Hf_xTa_yO_zN_w$. In an embodiment, floating gate dielectric 1142 is a dielectric stack containing at least one $Hf_xTa_yO_zN_w$ film and one or more layers of other insulating materials.

In an embodiment, control gate 1150 is formed on and contacts floating gate dielectric 1142. In an embodiment, control gate 1150 includes conductive material. In an embodiment, control gate 1150 is structured as one or more monolayers. In an embodiment, the control gate 1150 is an ALD layer. In an embodiment, control gate 1150 is a substituted metal layer. In an embodiment, control gate 1150 is a self-aligned metal layer. In an embodiment, the thickness of the control gate layer 1150 ranges from a monolayer to thousands of angstroms or more. In an embodiment, control gate 1150 is structured as one or more monolayers.

In an embodiment, both gate dielectric 1140 and floating gate dielectric 1142 are formed as dielectric layers containing a $Hf_xTa_yO_zN_w$ film structured as one or more monolayers. In an embodiment, control gate 1150 and floating gate 1152 are formed as conductive layers. In an embodiment, the control gate 1150 and floating gate 1152 are structured as one or more monolayers. In an embodiment, control gate 1150 and floating gate 1152 are ALD layers. In an embodiment, control gate 1150 and floating gate 1152 are substituted metal layers. In an embodiment, control gate 1150 and floating gate 1152 are self-aligned metal layers. In an embodiment, gate dielectric 1140, floating gate dielectric 1142, control gate 1150, and floating gate 1152 are realized by embodiments similar to those described herein, with the remaining elements of the transistor 1100 formed using processes known to those skilled in the art. In an embodiment, gate dielectric 1140 forms a tunnel gate insulator and floating gate dielectric 1142 forms an inter-gate insulator in flash memory devices, where gate dielectric 1140 and floating gate dielectric 1142 may include a hafnium tantalum oxynitride film structured as one or more monolayers. Floating gate transistor 1100 is not limited to the arrangement illustrated in FIG. 11. For example, floating gate transistor 1100 may be structured as a vertical transistor. Such structures are not limited to silicon-based substrates, but may be used with a variety of semiconductor substrates, such as for but not limited to germanium floating gate transistors, SiGe floating gate transistors, and gallium arsenide floating gate transistors.

Figure 12:
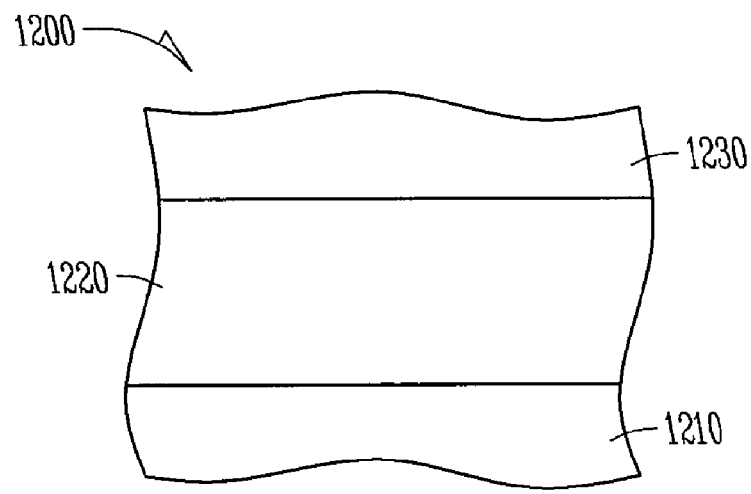
FIG. 12 shows an embodiment of a capacitor having a dielectric layer including a hafnium tantalum oxynitride film.

FIG. 12 shows an embodiment of a capacitor 1200 having a dielectric layer containing a hafnium tantalum oxynitride film 1220 and having an electrode 1230. Embodiments of a hafnium tantalum oxynitride film 1220 structured as one or more monolayers may also be applied to capacitors in various integrated circuits, memory devices, and electronic systems. In an embodiment for a capacitor 1200 illustrated in FIG. 12, a method includes forming a first conductive layer 1210, forming a dielectric layer 1220 containing a hafnium tantalum oxynitride film structured as one or more monolayers on first conductive layer 1210, and forming a second conductive layer 1230 on dielectric layer 1220. In various embodiments, second conductive layer 1230, first conductive layer 1210, or both second and first conductive layers 1230, 1210 are ALD conductive material layers, substituted metal layers, self-aligned metal layers, or a combination thereof. In an embodiment, the thickness of the conductive layer ranges from a monolayer to thousands of angstroms or more.

In an embodiment, dielectric layer 1220, containing a $Hf_xTa_yO_zN_w$ film, and conductive layers 1210, 1220 are formed using various embodiments described herein. In an embodiment, dielectric layer 1220 is realized as a dielectric layer formed substantially of $Hf_xTa_yO_zN_w$. In an embodiment, dielectric layer 1220 is a dielectric stack containing at least one $Hf_xTa_yO_zN_w$ film and one or more layers of other insulating materials. Embodiments for a hafnium tantalum oxynitride film include, but are not limited to, a capacitor in a DRAM and capacitors in analog, radio frequency (RF), and mixed signal integrated circuits. Mixed signal integrated circuits are integrated circuits that may operate with digital and analog signals.

Figure 13:
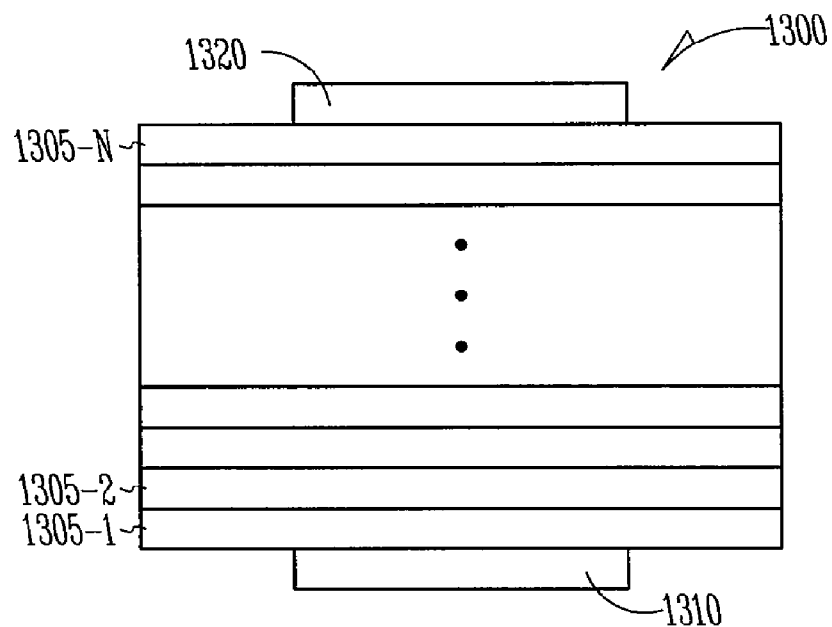
FIG. 13 depicts an embodiment of a dielectric layer having multiple layers including a hafnium tantalum oxynitride layer.

FIG. 13 depicts an embodiment of a dielectric structure 1300 having multiple dielectric layers 1305-1, 1305-2 . . . 1305-N, in which at least one layer is a hafnium tantalum oxynitride layer. In an embodiment, layers 1310 and 1320 provide a mechanism to contact dielectric layers 1305-1, 1305-2 . . . 1305-N. In an embodiment, each layer 1310, 1320 or both layers are conductive layers. In an embodiment, layers 1310 and 1320 are electrodes forming a capacitor. In an embodiment, layer 1310 is a body region of a transistor with layer 1320 being a gate. In an embodiment, layer 1310 is a floating gate electrode with layer 1320 being a control gate.

In an embodiment, dielectric structure 1300 includes one or more layers 1305-1, 1305-2 . . . 1305-N as dielectric layers other than a HfTaON layer, where at least one layer is a HfTaON layer. In an embodiment, dielectric layers 1305-1, 1305-2 . . . 1305-N include a HfO layer, a TaO layer, a HfON layer, a TaON layer, or various combinations of these layers. In an embodiment, dielectric layers 1305-1, 1305-2 . . . 1305-N include an insulating metal oxide layer. In an embodiment, dielectric layers 1305-1, 1305-2 . . . 1305-N include an insulating nitride layer. In an embodiment, dielectric layers 1305-1, 1305-2 . . . 1305-N include an insulating oxynitride layer. In an embodiment, dielectric layers 1305-1, 1305-2 . . . 1305-N include an insulating silicate layer.

Various embodiments for a dielectric layer containing a hafnium tantalum oxynitride film structured as one or more monolayers may enhance device performance by providing devices with reduced leakage current. Such improvements in leakage current characteristics may be attained by forming one or more layers of a hafnium tantalum oxynitride in a nanolaminate structure with other metal oxides, non-metal-containing dielectrics, or combinations thereof. The transition from one layer of the nanolaminate to another layer of the nanolaminate can disrupt an ordered structure in the nanolaminate stack. The term "nanolaminate" means a composite film of ultra thin layers of two or more materials in a layered stack. Typically, each layer in a nanolaminate has a thickness of less than 20 nm and may have a thickness less than a monolayer. In an embodiment, a HfO/HfTaON nanolaminate contains alternating layers of a HfO and HfTaON. In an embodiment, a HfON/HfTaON nanolaminate contains alternating layers of a HfON and HfTaON. In an embodiment, a TaON/HfTaON nanolaminate contains alternating layers of TaON and HfTaON. In an embodiment, a TaO/HfTaON nanolaminate contains alternating layers of TaO and HfTaON. In an embodiment, a $Ta_2O_5$/HfTaON nanolaminate contains alternating layers of a $Ta_2O_5$ and HfTaON. In an embodiment, a $HfO_2$/TaAlON nanolaminate contains alternating layers of $HfO_2$ and TaAlON. In an embodiment, a $Ta_2O_5$/AlON/$HfO_2$/TaON/TaAlON nanolaminate contains various permutations. In an embodiment, a HfO/TaON/TaO/HfON/HfTaON nanolaminate contains various permutations of hafnium oxide layers, tantalum oxynitride layers, tantalum oxide layers, hafnium oxynitride layers, and hafnium tantalum oxynitride layers.

In an embodiment, the sequencing of the layers in dielectric structure 1300 structured as a nanolaminate depends on the application. The effective dielectric constant associated with nanolaminate structure 1300 is that attributable to N capacitors in series, where each capacitor has a thickness defined by the thickness and composition of the corresponding layer. In an embodiment, by selecting each thickness and the composition of each layer, a nanolaminate structure may be formed with a predetermined dielectric constant. Embodiments for structures such as nanolaminate structure 1300 is used as nanolaminate dielectrics in flash memory devices as well as other integrated circuits. In an embodiment, a layer of the nanolaminate structure 1300 is used to store charge in a flash memory device. The charge storage layer of a nanolaminate structure 1300 in a flash memory device may be a silicon oxide layer.

In an embodiment, transistors, capacitors, and other devices include dielectric films containing a layer of a hafnium tantalum oxynitride composition with an electrode. In an embodiment, the hafnium tantalum oxynitride layer is an atomic layer deposited hafnium tantalum oxynitride layer. In an embodiment, the electrode is an atomic layer deposited electrode. In an embodiment, the electrode is a substituted metal layer. In an embodiment, the electrode is a self-aligned metal layer. In an embodiment, dielectric films containing a hafnium tantalum oxynitride layer with an electrode are implemented into memory devices and electronic systems including information handling devices. In various embodiments, information handling devices include wireless systems, telecommunication systems, and computers. In various embodiments, such electronic devices and electronic apparatus are realized as integrated circuits. Examples of circuits include, without limitation, transmit and receive circuitry, radio frequency transceivers, and optical transmitters and receivers.

Figure 14:
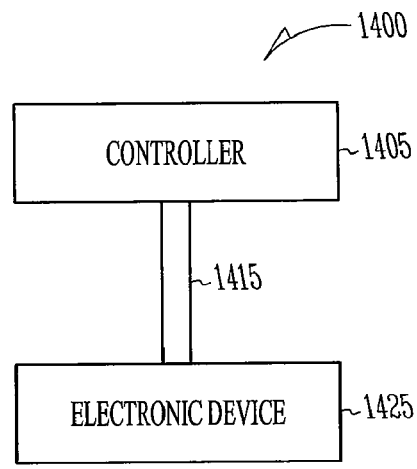
FIG. 14 is a simplified diagram for an embodiment of a controller coupled to an electronic device having a dielectric layer including a hafnium tantalum oxynitride film.

FIG. 14 illustrates a block diagram for an electronic system 1400 with one or more devices having a dielectric structure including a $Hf_xTa_yO_zN_w$ film with an electrode. Electronic system 1400 includes a controller 1405, a bus 1415, and an electronic device 1425, where bus 1415 provides electrical conductivity between controller 1405 and electronic device 1425. In various embodiments, controller 1405 includes an embodiment of a $Hf_xTa_yO_zN_w$ film with an electrode. In various embodiments, electronic device 1425 includes an embodiment of a $Hf_xTa_yO_zN_w$ film with an electrode. In various embodiments, controller 1405 and electronic device 1425 include embodiments of a $Hf_xTa_yO_zN_w$ film with an electrode. In an embodiment, electronic system 1400 includes, but is not limited to, fiber optic systems, electro-optic systems, telecommunication systems, wireless information handling systems such as cell phones and PDAs (personal digital assistants), GPS (global positioning system) receivers, data telemetry units, computer systems such as personal computers, MP3 (MPEG-1 Audio Layer-3) players, servers and routers, and control systems for use in automobiles such emission controls, automatic brakes, and entertainment systems.

Figure 15:
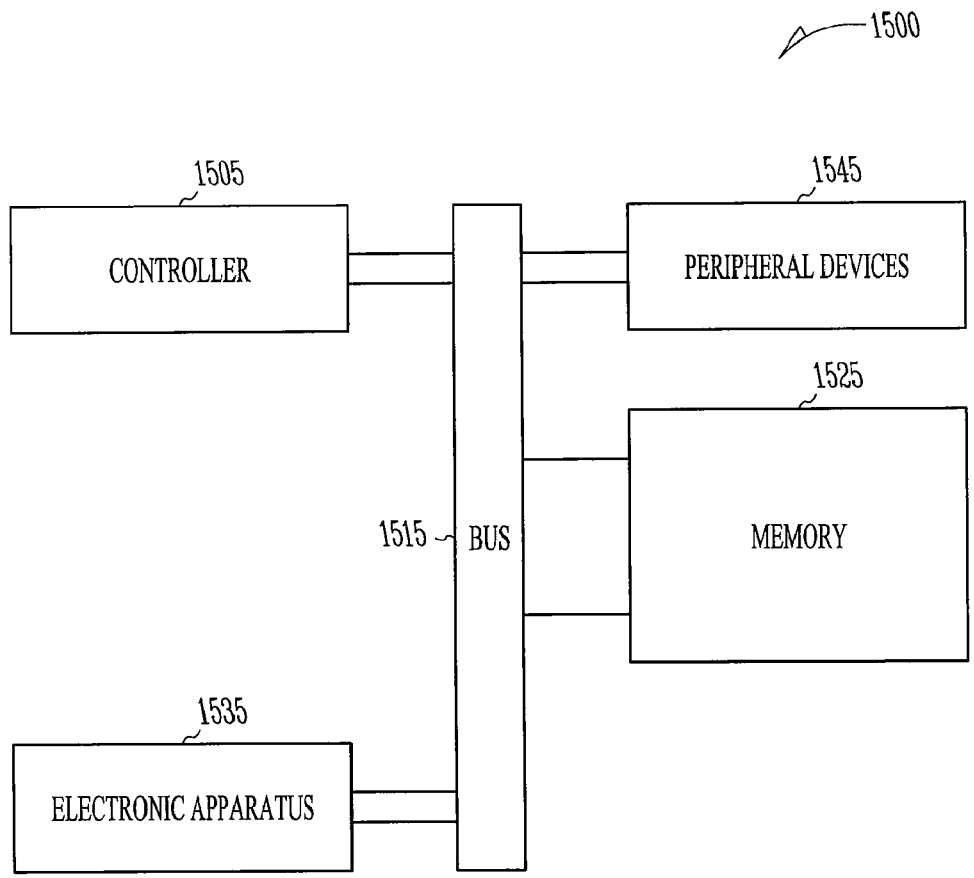
FIG. 15 illustrates a diagram for an embodiment of an electronic system including devices with a dielectric film including a hafnium tantalum oxynitride film.

FIG. 15 depicts a diagram of an embodiment of a system 1500 having a controller 1505 and a memory 1525. In an embodiment, controller 1505 includes a HfTaON film with an electrode. In an embodiment, memory 1525 includes a HfTaON film structured as one or more monolayers with an electrode. In an embodiment, controller 1505 and memory 1525 each include a HfTaON film with an electrode. In an embodiment, system 1500 also includes an electronic apparatus 1535 and a bus 1515, where bus 1515 provides electrical conductivity between controller 1505 and electronic apparatus 1535 and between controller 1505 and memory 1525. In an embodiment, bus 1515 includes an address bus, a data bus, and a control bus, each independently configured. In an alternative embodiment, bus 1515 uses common conductive lines for providing one or more of address, data, or control, the use of which is regulated by controller 1505. In an embodiment, electronic apparatus 1535 is additional memory configured in a manner similar to memory 1525. In an embodiment, additional peripheral device or devices 1545 are coupled to bus 1515. In an embodiment, peripheral devices 1545 include displays, additional storage memory, or other control devices that operate in conjunction with controller 1505. In an alternative embodiment, peripheral devices 1545 include displays, additional storage memory, or other control devices that operate in conjunction with memory 1525, or controller 1505 and memory 1525. In an embodiment, controller 1505 is a processor. In an embodiment, one or more of controller 1505, memory 1525, bus 1515, electronic apparatus 1535, or peripheral devices 1545 include an embodiment of a dielectric layer having a HfTaON film structured as one or more monolayers with an electrode. In an embodiment, system 1500 includes, but is not limited to, information handling devices, telecommunication systems, and computers.

In an embodiment, memory 1525 is realized as a memory device containing a HfTaON film structured as one or more monolayers with an electrode. In an embodiment, a HfTaON structure with a conductive layer is formed in a memory cell of a memory array. In an embodiment, such a structure is formed in a capacitor in a memory cell of a memory array. In an embodiment, such a structure is formed in a transistor in a memory cell of a memory array. In an embodiment, it will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

This description refers to the accompanying drawings that show, by way of illustration, specific details and embodiments. These embodiments are described in sufficient detail to enable those skilled in the art to practice the present invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The terms wafer and substrate may be used interchangeably herein to refer generally to any structure on which integrated circuits are formed and also to such structures during various stages of integrated circuit fabrication. The term substrate is understood to include a semiconductor wafer; it may be used to refer to semiconductor structures during processing and may include other layers that have been fabricated thereupon. Both wafers and substrates can include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors. The term transistor is understood generally to include an insulated gate field effect transistor such as a metal oxide field effect transistor (MOSFET) and includes complementary metal oxide field effect transistor (CMOS), p-channel (PMOS) and n-channel (NMOS) field effect transistors and other such using an electric field for producing a charge inversion layer. The term capacitor is understood to generally include capacitive structures such as used to store electric charge or to provide an electric field between conductive regions. The term composite is understood generally to include a mixture of two or more elements. The terms, refractory oxide, refractory nitride and refractory oxynitride is understood generally to mean an oxide, a nitride, and an oxynitride, respectively, that include a refractory metal. The term refractory metal-based is understood to mean a composition including a refractory metal.

Although specific embodiments have been illustrated and described herein, it will be appreciated by those of ordinary skill in the art that any arrangement that is calculated to achieve the same purpose may be substituted for the specific embodiments shown. Various embodiments may use permutations and/or combinations of embodiments described herein. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
forming an insulator on a substrate, the insulator including HfTaON, the substrate supporting a polycrystalline conductive layer;
forming a substitutable material on and contacting the insulator; and
forming a metal on and contacting the insulator by substituting the metal for the substitutable material using a metal-substitution reaction.

2. A method comprising:
forming the insulator on a substrate, the insulator including HfTaON, the substrate supporting a polycrystalline conductive layer, wherein forming an insulator includes forming HfTaON with less than 50 atomic percent nitrogen.

3. The method of claim 2, wherein forming the insulator includes forming HfTaON with at least 20 atomic percent oxygen.

4. A method comprising:
forming an insulator on a substrate, the insulator including HfTaON, the substrate supporting a polycrystalline conductive layer, forming HfTaON including:
forming a $HfO_2$ film;
forming a $Ta_2O_5$ film in contact with the $HfO_2$ film; and
heating the $HfO_2$ film and the $Ta_2O_5$ film in a vapor that includes nitrogen to form the HfTaON layer.

5. The method of claim 4, wherein forming the insulator includes alternating the $HfO_2$ film and the $Ta_2O_5$ film a specified number of times to form a composite film.

6. The method of claim 4, wherein heating includes heating in a vapor that includes at least one of a nitrogen, an ammonia, a tert-butylamine, an allylamine, and a 1,1-dimethylhydrazine.

7. A method comprising:
forming an insulator on a substrate, the insulator including HfTaON, the substrate supporting a polycrystalline conductive layer, forming HfTaON including:
forming a HfN layer;
forming a TaN layer in contact with the HfN layer; and
annealing the HfN layer and the TaN layer in a vapor environment that includes oxygen.

8. The method of claim 7, wherein forming the insulator includes alternating the HfN layer and the TaN layer to form a dielectric stack.

9. The method of claim 7, wherein annealing includes heating in an environment comprising at least one of an $O_2$ vapor, and a $H_2O$ vapor to form the HfTaON.

10. The method of claim 7, wherein annealing includes annealing to form a HfTaON layer with less than 50 atomic percent nitrogen and greater than 20 atomic percent oxygen.

11. The method of claim 7, wherein annealing includes annealing to form at least a partially stoichiometric HfTaON layer.

12. A method comprising:
forming an insulator on a substrate, the insulator including HfTaON, the substrate supporting a polycrystalline conductive layer, wherein forming the insulator includes forming HfON and TaON.

13. The method of claim 12, wherein the method includes annealing the HfON and the TaON including reacting the HfON and the TaON to form the HfTaON.

14. The method of claim 12, wherein the forming includes stacking one or more layers of HfON and one or more layers of TaON.

15. The method of claim 14, wherein the stacking includes alternating the one or more layers of HfON and one or more layers of TaON.

16. The method of claim 14, wherein the forming includes heating the one or more layers of HfON and the one or more layers of TaON to form the HfTaON.

17. The method of claim 14, wherein the forming includes reacting the one or more layers of HfON and the one or more layers of TaON in a vapor ambient including at least one of an oxygen vapor and a nitrogen vapor.

18. The method of claim 14, wherein the forming includes reacting the one or more layers of HfON and the one or more layers of TaON using at least one vapor selected from a group consisting essentially of $H_2O$, $H_2O_2$, t-$BuNH_2$, and allyl$NH_2$.

19. A method comprising:
    forming an insulator on a substrate, the insulator including HfTaON, the substrate supporting a polycrystalline conductive layer; and
    forming a conductive material on and contacting the insulator by forming sacrificial carbon on the insulator and replacing the sacrificial carbon with the conductive material.

20. The method of claim 19, wherein forming the conductive material includes forming one or more of aluminum, tungsten, molybdenum, gold, silver, gold alloy, silver alloy, copper, platinum, rhenium, ruthenium, rhodium, nickel, osmium, palladium, iridium, cobalt, germanium, or a metallic nitride.

21. The method of claim 19, wherein forming the insulator on the substrate includes forming the insulator on a semiconductor-based substrate.

22. The method of claim 21, wherein forming the insulator on the semiconductor-based substrate includes forming the insulator on a silicon substrate, a silicon-on-insulator, or a silicon-on-sapphire substrate.

23. A method comprising:
    forming an insulator on a substrate, the insulator including HfTaON, the substrate supporting a polycrystalline conductive layer; and
    forming a conductive material on and contacting the insulator, wherein forming the insulator includes forming one or more of HfO, TaO, HfON, TaON, an insulating metal oxide, an insulating nitride, or an insulating silicate layer, in addition to the HfTaON.

24. The method of claim 19, wherein the method includes forming the HfTaON in a nanolaminate.

25. A method comprising:
    forming an insulator on a substrate, the insulator including HfTaON, the HfTaON formed in a nanolaminate, the substrate supporting a polycrystalline conductive layer;
    forming the nanolaminate having a silicon oxide layer configured as a charge storage layer; and
    forming a conductive material on and contacting the insulator.

* * * * *